US011289457B2

(12) United States Patent
Park

(10) Patent No.: US 11,289,457 B2
(45) Date of Patent: *Mar. 29, 2022

(54) METHOD AND DEVICE FOR CONTROLLING OPERATION USING TEMPERATURE DEVIATION IN MULTI-CHIP PACKAGE

(71) Applicant: SAMSUNG ELECTRONICS CO., LTD., Suwon-si (KR)

(72) Inventor: Min-Sang Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/002,557

(22) Filed: Aug. 25, 2020

(65) Prior Publication Data

US 2020/0388594 A1 Dec. 10, 2020

Related U.S. Application Data

(60) Continuation of application No. 16/782,267, filed on Feb. 5, 2020, now Pat. No. 10,804,248, which is a
(Continued)

(30) Foreign Application Priority Data

Apr. 8, 2015 (KR) ........................ 10-2015-0049952

(51) Int. Cl.
*H01L 25/065* (2006.01)
*H01L 23/34* (2006.01)
(Continued)

(52) U.S. Cl.
CPC .......... *H01L 25/0657* (2013.01); *G06F 13/00* (2013.01); *G11C 11/40626* (2013.01);
(Continued)

(58) Field of Classification Search
CPC ..... H01L 25/0657; H01L 25/18; H01L 23/34; H01L 224/45099; H01L 224/48091; H01L 224/48137; G06F 13/00
See application file for complete search history.

(56) References Cited

U.S. PATENT DOCUMENTS

| 7,584,369 B2 | 9/2009 | Capps, Jr. et al. |
| 8,502,070 B2 | 8/2013 | Horan et al. |

(Continued)

FOREIGN PATENT DOCUMENTS

| CN | 102543941 A | 7/2012 |
| CN | 103950886 A | 7/2014 |

(Continued)

OTHER PUBLICATIONS

Chinese Patent Office Action dated Mar. 17, 2020 Cited in Related Chinese Patent Application No. CN 201610217725.5.
(Continued)

*Primary Examiner* — Marc Anthony Armand
(74) *Attorney, Agent, or Firm* — Volentine, Whitt & Francos, PLLC

(57) ABSTRACT

A multi-chip package includes a first die having temperature sensors and a second die. The first die generates temperature deviation information of m (m<n) bits based on temperature information of n bits produced by the temperature sensors. The first die provides the temperature deviation information of m bits rather than the temperature information of n bits to the second die. An internal operation of the second die is controlled using the temperature deviation information output by the first die.

17 Claims, 22 Drawing Sheets

Related U.S. Application Data division of application No. 16/121,949, filed on Sep. 5, 2018, now Pat. No. 10,593,650, which is a continuation of application No. 15/620,978, filed on Jun. 13, 2017, now Pat. No. 10,090,281, which is a continuation of application No. 15/007,243, filed on Jan. 27, 2016, now Pat. No. 9,711,487.

(51) Int. Cl.
    *G06F 13/00*     (2006.01)
    *G11C 11/406*     (2006.01)
    *H01L 25/18*     (2006.01)
    *H01L 23/00*     (2006.01)

(52) U.S. Cl.
    CPC .............. *H01L 23/34* (2013.01); *H01L 25/18* (2013.01); *H01L 24/48* (2013.01); *H01L 2224/45099* (2013.01); *H01L 2224/48091* (2013.01); *H01L 2224/48137* (2013.01); *H01L 2225/06544* (2013.01); *H01L 2225/06589* (2013.01); *H01L 2225/06596* (2013.01); *H01L 2924/00014* (2013.01); *H01L 2924/1436* (2013.01)

(56) References Cited

U.S. PATENT DOCUMENTS

| | | | |
|---|---|---|---|
| 8,502,073 B2 | 8/2013 | Horan et al. |
| 8,674,223 B2 | 3/2014 | Horan et al. |
| 8,674,224 B2 | 3/2014 | Horan et al. |
| 8,674,225 B2 | 3/2014 | Horan et al. |
| 8,674,226 B2 | 3/2014 | Horan et al. |
| 8,680,395 B2 | 3/2014 | Horan et al. |
| 8,724,415 B2 | 5/2014 | Kuroda |
| 8,743,582 B2 | 6/2014 | Kang et al. |
| 8,801,279 B2 | 8/2014 | Kim et al. |
| 8,891,327 B2 | 11/2014 | Kim |
| 9,040,823 B2 | 5/2015 | Horan et al. |
| 9,076,575 B2 | 7/2015 | Horan et al. |
| 9,584,889 B2 | 2/2017 | Escher-Poeppel et al. |
| 9,711,487 B2 | 7/2017 | Park |
| 10,090,281 B2 | 10/2018 | Park |
| 2010/0165692 A1 | 7/2010 | Jeddeloh |
| 2011/0234300 A1 | 9/2011 | Zhang et al. |
| 2012/0061059 A1 | 3/2012 | Hsiao et al. |
| 2012/0249218 A1 | 10/2012 | Shoemaker |
| 2013/0162313 A1 | 6/2013 | Kim |
| 2013/0166093 A1 | 6/2013 | Kim et al. |
| 2013/0264610 A1 | 10/2013 | Chen et al. |
| 2014/0022002 A1* | 1/2014 | Chua-Eoan ............ H01L 35/00 327/512 |
| 2014/0233292 A1 | 8/2014 | Kang et al. |
| 2014/0241440 A1 | 8/2014 | Horan et al. |
| 2014/0333271 A1 | 11/2014 | Kim |
| 2015/0148905 A1 | 5/2015 | Parrish |
| 2016/0148905 A1* | 5/2016 | Yu ........................ H01L 25/0657 257/48 |
| 2019/0178728 A1* | 6/2019 | Kawaguchi ........ H05K 7/20927 |

FOREIGN PATENT DOCUMENTS

| | | |
|---|---|---|
| CN | 104418291 A | 3/2015 |
| JP | 2009252277 | 10/2009 |
| JP | 2011154744 | 8/2011 |
| JP | 2011170943 | 9/2011 |
| KR | 1020110096481 A | 8/2011 |
| KR | 1020110129149 A | 12/2011 |
| KR | 1020120126243 A | 11/2012 |
| KR | 1020130073395 A | 7/2013 |
| KR | 1020130074293 A | 7/2013 |
| KR | 1020140085229 A | 7/2014 |

OTHER PUBLICATIONS

Korean Office Action dated Jan. 28, 2021 Cited in KR Patent Application No. 2015-49952.

* cited by examiner

METHOD AND DEVICE FOR CONTROLLING OPERATION USING TEMPERATURE DEVIATION IN MULTI-CHIP PACKAGE

PRIORITY STATEMENT

This application is a Continuation of U.S. application Ser. No. 16/782,267, filed Feb. 5, 2020, now U.S. Pat. No. 10,804,248, issued Oct. 13, 2020, which is a Divisional of U.S. application Ser. No. 16/121,949, filed Sep. 5, 2018, which is a Continuation of U.S. application Ser. No. 15/620,978, filed Jun. 13, 2017, now U.S. Pat. No. 10,090,281, issued Oct. 2, 2018, which is a Continuation of U.S. application Ser. No. 15/007,243, filed Jan. 27, 2016, now U.S. Pat. No. 9,7611,487 B2, issued Jul. 18, 2017, which claims the benefit of Korean Patent Application No. 10-2015-0049952, filed on Apr. 8, 2015, in the Korean Intellectual Property Office, the disclosure of which is hereby incorporated by reference in its entirety.

BACKGROUND

The inventive concept relates to semiconductor devices. More particularly, the inventive concept relates to semiconductor devices, such as DRAMs, having operating characteristics that are temperature dependent, and to multi-chip semiconductor device packages including a first die and a second die for controlling an operation of the first die based on temperature of an ambient.

In a dynamic random access memory (DRAM) data is written, i.e., a write operation is performed, by storing a charge in a cell capacitor. However, the charge stored in the capacitor of a DRAM dissipates as time passes without any read or write operation being performed, due to a leakage current of the cell capacitor. The leakage current of the DRAM has a temperature dependency, wherein the amount of leakage current of the DRAM is relatively small when the DRAM is at a relatively low temperature, and is conversely relatively great when the DRAM is at a high temperature. The DRAM performs a refresh operation to sense and re-write data, before losing the charge of the cell capacitor due to leakage current. Therefore, the refresh operation of the DRAM may be controlled so that its refresh cycle is relatively long when the DRAM is at a low temperature, and is relatively short when the DRAM is at a high temperature.

SUMMARY

According to an aspect of the inventive concept, there is provided a multi-chip package including a first die which has first temperature sensors that sense temperatures at areas at which the first temperature sensors are located and output the sensed temperatures as first temperature information of n bits, and at least one second die packaged with the first die, and in which the first die is configured to generate first temperature deviation information of m bits based on the first temperature information, wherein m is less than n, and n is a natural number equal to or greater than 2, and each second die is operatively connected to the first die to receive the first temperature deviation information generated by the first die, and is configured to perform an internal operation and to control the internal operation based on the first temperature deviation information.

According to another aspect of the inventive concept, there is provided a memory device including a first die which includes a first temperature sensor configured to sense a temperature state, outputs the sensed temperature state as first temperature information of n bits, and based on the first temperature information of n bits, provides temperature characteristic information of m bits, the m bits being less than the n bits, and at least one second die which includes a first memory cell array, does not include a temperature sensor in a location corresponding to the first temperature sensor, receives the temperature characteristic information of the first die, and controls an internal operation of the second die based on the temperature characteristic information.

According to another aspect of the inventive concept, there is provided a memory device including a first die which has a substrate, first temperature sensors arrayed across the substrate and which sense temperatures at areas of the substrate at which they are located and output information of the sensed temperatures, respectively, and a calculator operatively connected to the temperature sensors to receive the information output by the temperature sensors and configured to produce first temperature information based on the information output by the temperature sensors, and a second die packaged with the first die and having an operation controller operatively connected to the calculator of the first die, and circuitry that performs an internal operation that is temperature dependent, the circuitry being operatively connected to the operation controller, and in which the operation controller is configured to control at least one parameter of the internal operation of the second die on the basis of the first temperature information produced by the first die.

According to another aspect of the inventive concept, there is provided a memory device including a first die which has a substrate, first temperature sensors arrayed across the substrate and which sense temperatures at areas of the substrate at which they are located and output information of the sensed temperatures, respectively, and a calculator operatively connected to the temperature sensors to receive the information output by the temperature sensors and configured to produce first temperature information based on the information output by the temperature sensors, and a stack of second dies packaged with the first die and electrically connected thereto, in which each second die has an operation controller, and circuitry performing an operation that is temperature dependent, the circuitry being operatively connected to the operation controller, and in which the operation controller is configured to control at least one parameter of the operation performed by the circuitry of the second die on the basis of the first temperature information produced by the first die.

BRIEF DESCRIPTION OF THE DRAWINGS

The inventive concept will be more clearly understood from the following detailed description of examples thereof taken in conjunction with the accompanying drawings in which.

DETAILED DESCRIPTION

Figure 1:
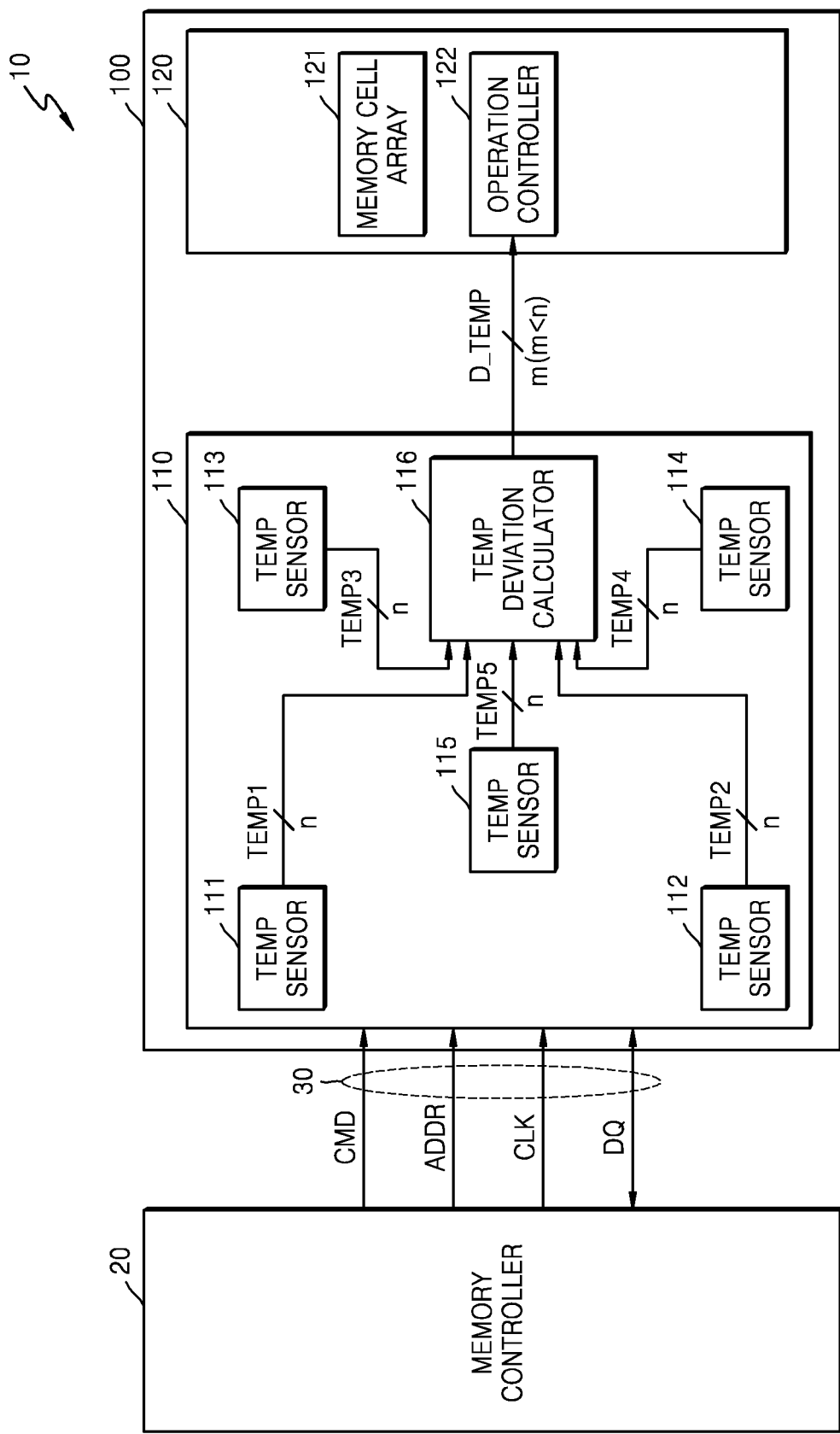
FIG. 1 is a block diagram of a memory system including a memory device, according to the inventive concept.

Hereinafter, the inventive concept will now be described more fully with reference to the accompanying drawings, in which examples of the inventive concept are shown. Like reference numerals in the drawings denote like elements, and a repeated explanation will not be given of overlapping features. Expressions such as "at least one of," when preceding a list of elements, modify the entire list of elements and do not modify the individual elements of the list. As used herein, the term "and/or" includes any and all combinations of one or more of the associated listed items. These inventive concept may, however, be exemplified in different forms and should not be construed as limited to the examples set forth herein. Rather, these examples are provided so that this disclosure is thorough and complete and fully conveys the inventive concept to those skilled in the art. It should be understood that examples of the inventive concept are to cover all modifications, equivalents, and alternatives falling within the spirit and scope of the inventive concept. In the attached drawings, sizes of structures may be exaggerated for clarity.

The terminology used herein is for describing particular examples and is not intended to be limiting. As used herein, the singular forms "a," "an," and "the," are intended to include the plural forms as well, unless the context clearly displays otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meanings as commonly understood in the art to which the inventive concept belongs. It will be further understood that the terms such as those defined in commonly used dictionaries should be interpreted as having meanings consistent with their meanings in the context of the relevant art and will not be interpreted in an idealized or overly formal sense unless expressly so defined herein.

The inventive concept will be explained using a DRAM as an example of a semiconductor device performing an operation having a characteristic that is temperature dependent and which may benefit from being controlled according to the temperature of its ambient.

A high capacitance DRAM may be realized as a multi-chip package including a plurality of memory dies (or a plurality of memory layers). The memory dies may be stacked in the package. The DRAM may further include a logic die which is electrically connected to the stacked memory dies. The logic die may receive commands, addresses, clock signals, and data from a memory controller, and may provide a signal distribution function of providing the received commands, addresses, clocks, and data to the memory dies. The logic die buffers all of the commands, addresses, clock signals, and data. Thus, the logic die can operate as a memory buffer between the memory controller and the memory dies. The logic die and the memory dies may exchange signals via through silicon vias (TSVs) or wire bonds.

The temperature of the DRAM may be increased by heat generated due to operations of the logic die and the memory dies. The DRAM may perform a refresh operation for each of the memory dies. For matters of efficiency, i.e., to maximize the operating speed of the DRAM, the refresh operation is controlled based on the temperature of the DRAM. In particular, the refresh operation of each memory die is typically controlled according to information of the temperature of the other memory dies or the logic die. However, a relatively large amount of wiring is required for transferring such temperature information between dies. A lack of available space in a multi-chip package may make it difficult to provide such a large amount of wiring.

FIG. 1 illustrates a memory system 10 according to the inventive concept, which may be realized in the form of a DRAM. As will be described in more detail later on, according to the present inventive concept, such a memory system, e.g., a DRAM, which operates using a minimal amount of temperature information, may be realized so that the number of wirings needed to transmit such temperature information throughout the memory system is minimized as well.

Referring now to FIG. 1, though, the memory system 10 includes a memory controller 20 and a memory device 100. The memory system 10 may allocate a program code which is a combination of commands and data, to the memory device 100, for executing an application program by a processor. The memory controller 20 may be provided in the processor, or may be realized as a chip which is separate from the processor and connected to the processor. The memory controller 20 may support read and/or write memory transaction(s) for accessing the memory device 100.

The memory controller 20 may perform a memory transaction by other chipsets forming the memory system 10, in addition to the processor. For example, when the system constitutes a computing device, the chipset may be one or more integrated circuit (IC) package or chips, which connect components, such as basic input/output system (BIOS) firmware, keyboards, a mouse, storage devices, network interfaces, a power management integrated circuit (PMIC), etc., to the processor.

The memory controller 20 may be connected to the memory device 100 via a bus 30. Commands CMD, addresses ADDR, clocks CLK, and data DQ which are output from the memory controller 20 may be transmitted to the memory device 100 via the bus 30. In the bus 30, a command bus and an address bus may be realized as a line so that the commands CMD and the addresses ADDR may be time-sequentially transmitted. The data DQ output in the memory device 100 may be transmitted to the memory controller 20 via the bus 30, in response to the commands CMD of the memory controller 20.

The memory device 100 may be a multi-chip package including a first die 110 and a second die 120. The first die 110 may receive commands CMD, addresses ADDR, clock signals CLK, and data DQ from the controller 20, and may provide the received commands CMD, addresses ADDR, clock signals CLK, and data DQ to the second die 120. The first die 110 may operate as a memory buffer which buffers the commands CMD, addresses ADDR, clock signals CLK, and data DQ and transmits the buffered commands CMD, addresses ADDR, clock signals CLK, and data DQ to the second die 120. The first die 110 may thus be referred to as a logic die, and the second die 120 may thus be referred to as a memory die.

The first die 110 may include at least two temperature sensors occupying respective areas of the die for use in calculating temperature deviation information D_TEMP (described in more detail below). For example, the first die 110 may include temperature sensors 111 to 115 occupying respective areas of the die. The first temperature sensor 111 may occupy an upper-left area of the first die 110, the second temperature sensor 112 may occupy a bottom-left area of the first die 110, the third temperature sensor 113 may occupy an upper-right area of the first die 110, the fourth temperature sensor 114 may occupy a bottom-right area of the first die 110, and the fifth temperature sensor 115 may occupy the center of the first die 110, as viewed in plan.

The temperature sensors 111 to 115 may each sense a temperature at its respective area and may output the sensed temperatures as temperature information TEMP1 to TEMP5, respectively. The temperature information TEMP1 to TEMP5 may include n bits representative of a sensed temperature state.

The first die 110 may include a temperature deviation calculator 116 configured to calculate temperature differences among the temperature information TEMP1 to TEMP5 produced by the temperature sensors 111-115. The temperature deviation calculator 116 may receive the temperature information TEMP1 to TEMP5 of the temperature sensors 111 to 115 calculate a temperature difference using one of more values of the temperature information TEMP1 to TEMP5, and output the calculation as temperature deviation information D_TEMP.

For example, the temperature deviation calculator 116 is configured to select the highest temperature and the lowest temperature from among the temperature information TEMP1 to TEMP5, calculate a temperature difference between the selected highest temperature and the selected lowest temperature, and output the calculation as temperature deviation information D_TEMP. In another example, the temperature deviation calculator 116 is configured select the highest temperature from among the temperature information TEMP1 to TEMP5, calculate a difference between the highest temperature and a reference temperature, and output the calculation as the temperature deviation information D_TEMP. According to still another example, the temperature deviation calculator 116 is configured to select the lowest temperature from among the temperature information TEMP1 to TEMP5, calculate a difference between the lowest temperature and the reference temperature, and output the calculation result as the temperature deviation information D_TEMP. In addition, the temperature deviation calculator 116 may apply a temperature environment variable (i.e., a coefficient or constant) to the temperature difference calculated using the one or more values of the temperature information TEMP1 to TEMP5. In this case, the temperature deviation information D_TEMP reflects the temperature environment variable.

In the examples above in which the temperature deviation calculator 116 uses a reference temperature, the reference temperature may be stored in a register or the like in the first die 100 as a previously provided value, or may be provided by the memory controller 20 in real time. Also, the reference temperature may be calculated via the first die 110 or the second die 120 using the temperatures measured by the temperature sensors 111 to 115. In this case, the reference temperature may be an average of the measured temperatures.

In any case, the temperature deviation information D_TEMP output by the temperature deviation calculator 116 may consist of m (m<n) bits of information. The m bits of the temperature deviation information D_TEMP may be those bits having the lowest values among the n bits of temperature information TEMP1 to TEMP5. In practice, the deviation among the temperature information TEMP1 to TEMP5 of the temperature sensors 111 to 115 may be plus or minus 5° C. Thus, for example, when the temperature information TEMP1 to TEMP5 consists of 8 bits, the temperature deviation information D_TEMP may be the 3 bits of the temperature information TEMP1 to TEMP5 having the lowest values. Alternatively, the temperature deviation information D_TEMP may be 3 bits having the lowest values from among 8 bits whose values are the result of calculations using the temperature information TEMP1 to TEMP5. In any case, the temperature deviation calculator 116 may output the temperature deviation information D_TEMP of m bits, the m bits being less than the n bits of the temperature information TEMP1 to TEMP5, and provide the output temperature deviation information D_TEMP to the second die 120.

The second die 120 may comprise any of various types of memories providing addressable storage locations from and/or to which data may be read and/or written via the memory controller 20. The second die 120 may comprise, for example, dynamic random access memory (DRAM) devices, synchronous DRAM (SDRAM) devices, a double data rate (DDR) SDRAM device, or the like.

In the illustrated example, the second die 120 includes a memory cell array 121 and an operation controller 122. The memory cell array 121 may include a plurality of memory cells which are arranged in rows and columns Each memory cell may have one access transistor and one storage capacitor. The memory cells may be arranged such that each of the memory cells is located at a cross point of a matrix of word lines and bit lines. The data provided from the memory controller 20 may be written in the memory cells of the memory cell array 121.

In one example, the memory cell array 121 is a three-dimensional (3D) memory array. The 3D memory array may include circuits at several levels, respectively, with each circuit being disposed on or in an active region of substrate. The 3D memory array is monolithic, meaning that the levels of circuits in the array are stacked directly one above another. In this respect, reference may be made to U.S. Pat. Nos. 7,679,133, 8,553,466, 8,654,587, and 8,559,235, and US Patent Application Publication No. 2011/0233648 which disclose 3D memory arrays of the type that may be used to provide the memory cell array 121.

The operation controller 122 of the second die 120 may control functions, characteristics, and modes of the second die 120 by using the temperature deviation information D_TEMP provided by the first die 110. The operation controller 122 may control at least one "operating characteristic" selected from the group consisting of a refresh operation, a DC level, and an AC timing of the second die 120, based on the temperature deviation information D_TEMP.

Figure 2:
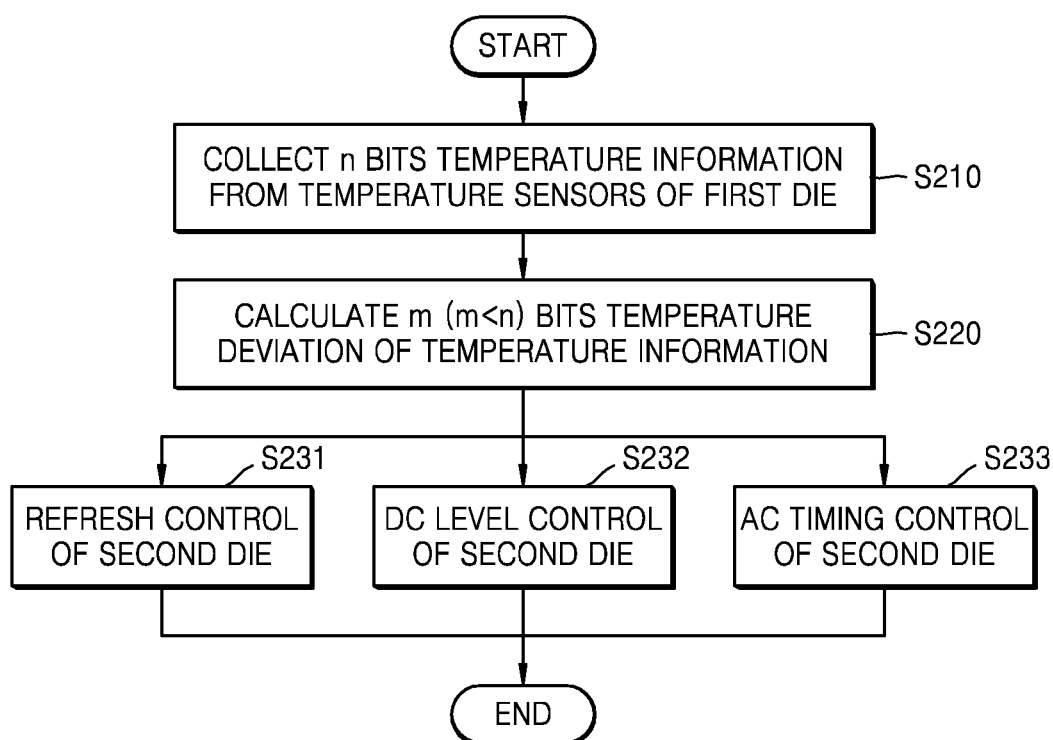
FIG. 2 is a flowchart illustrating an operation of the memory device of FIG. 1.

FIG. 2 is a flowchart illustrating an operation of the memory device 100 of FIG. 1.

Referring to FIGS. 1 and 2 together, the memory device 100 may collect the temperature information TEMP1 to TEMP5 of n bits from each of the temperature sensors 111 to 115 of the first die 110, in operation S210.

The temperature information TEMP1 to TEMP5 of the temperature sensors 111 to 115 may be provided to the temperature deviation calculator 116, in the first die 110. The temperature deviation information D_TEMP of m (m<n) bits may be calculated via the temperature deviation calculator 116, based on the temperature information TEMP1 to TEMP5, in operation S220. For example, as was described previously in detail, the difference between the highest temperature and the lowest temperature from among the temperature information TEMP1 to TEMP5 may be calculated as the temperature deviation information D_TEMP. Alternatively, the temperature deviation information D_TEMP may be calculated as a difference between the highest temperature and a reference temperature. According to still another example, the temperature deviation information D_TEMP may be calculated as a difference between the lowest temperature and the reference temperature. Also, this step may include applying a temperature environment variable (TEV) to the temperature difference calculated using the temperature information TEMP1 to TEMP5. The temperature environment variable TEV is, for example, a constant or coefficient, based on a structural characteristic of the multi-chip package. For example, the temperature environment variable TEV may comprise a heat transfer coefficient dependent on the physical distance between the dies stacked in the multi-chip package.

The temperature deviation information D_TEMP of the first die 110 may be provided to the second die 120. The second die 120 may transfer the temperature deviation information D_TEMP to the operation controller 122, and the operation controller 122 may control functions, characteristics, and modes of the second die 120 according to the temperature deviation information D_TEMP.

In the second die 120, the operation controller 122 may control a refresh operation according to the temperature deviation information D_TEMP in operation S231. Therefore, the second die 120 may control a refresh characteristic of the second die 120 according to a temperature difference value indicated by the temperature deviation information D_TEMP. For example, when the temperature difference value is large, the refresh cycle may be set to be short, and when the temperature difference value is small, the refresh cycle may be set to be long.

In the second die 120, the operation controller 122 may control the DC level according to the temperature deviation information D_TEMP in operation S232. The second die 120 may set DC parameters including an operation voltage range, a reference voltage level, a strength of an output driver, write leveling, and read leveling of the second die 120, according to the temperature deviation information D_TEMP.

In the second die 120, the operation controller 122 may control the AC timing according to the temperature deviation information D_TEMP in operation S233. The second die 120 set AC parameters including a clock latency, a command latency, a signal transfer latency, and timing delays of the second die 120, according to the temperature deviation information D_TEMP.

Examples of memory devices in the form of multi-chip packages according to the inventive concept will now be described with reference to FIGS. 3-17. FIGS. 3, 4 and 7-14 respectively illustrate memory devices 100a, 100b, 100c, 100d, 100e, 100f, 100g, 100h, and 100i whose memory dies do not include their own temperature sensors. On the other hand, FIGS. 15-17 respectively illustrate memory devices 100j, 100k, and 100l whose memory dies include their own temperature sensors.

Figure 3:
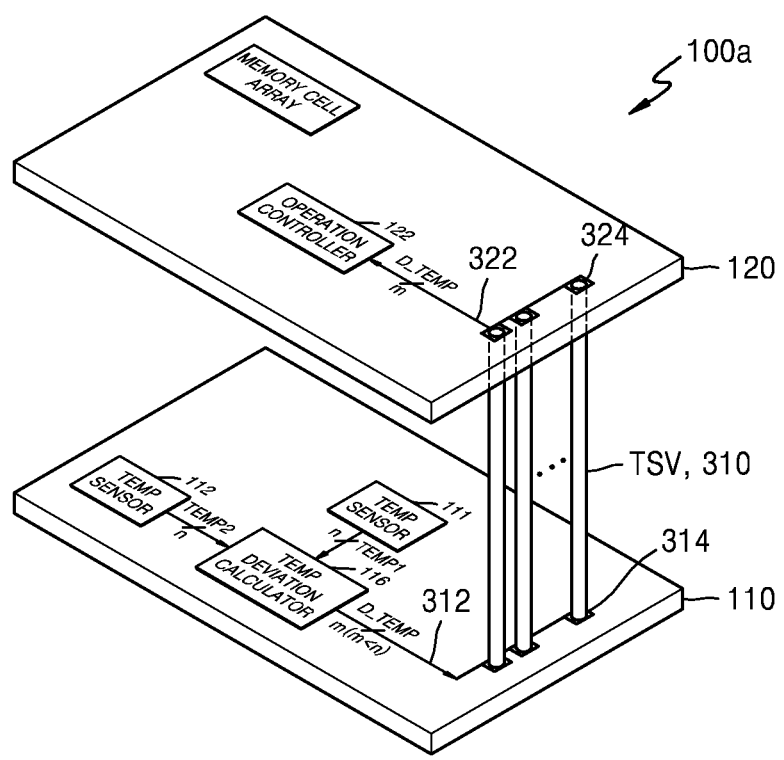
FIG. 3 is a perspective view in schematic form of a first example of a multi-chip package according to the inventive concept.

Referring now to FIG. 3, the memory device 100a may be a multi-chip package having a structure in which the first die 110 and the second die 120 are vertically stacked. The first die 110 of the memory device 100a may be a logic die, and the second die 120 may be a memory die. The first die 110 of the memory device 100a may include temperature sensors 111 and 112 and temperature deviation calculator 116. The temperature sensors 111 and 112 may generate temperature information TEMP1 and TEMP2 corresponding to the sensed temperature states.

The first die 110 has been shown and described as having only two temperature sensors 111 and 112. However, this is for convenience of explanation. That is, the first die 110 may have two or more temperature sensors. For example, the first die 110 may have five temperature sensors 111 to 115 as illustrated in FIG. 1.

The temperature deviation calculator 116 may receive the temperature information TEMP1 and TEMP2 of the temperature sensors 111 and 112 and output a temperature difference between the temperature information TEMP1 and TEMP2 as the temperature deviation information D_TEMP. The temperature deviation calculator 116 may output the temperature deviation information D_TEMP of m (m<n) bits based on the temperature information TEMP1 and TEMP2 of n bits.

The temperature deviation information D_TEMP may be provided to the second die 120 via a signal path including m through silicon vias (TSVs) 310. The TSVs 310 may provide electrical connections by being connected to conductive lines 312 and 322 and conductive pads 314 and 324 of the first die 110 and the second die 120.

The second die 120 receives the temperature deviation information D_TEMP of the first die 110. The operation controller 122 of the second die 120 may control an operation of the second die 120 according to the temperature deviation information D_TEMP. For example, the operation controller 122 may control a refresh operation, a DC level, and/or an AC timing of the second die 120 according to the temperature deviation information D_TEMP.

Figure 4:
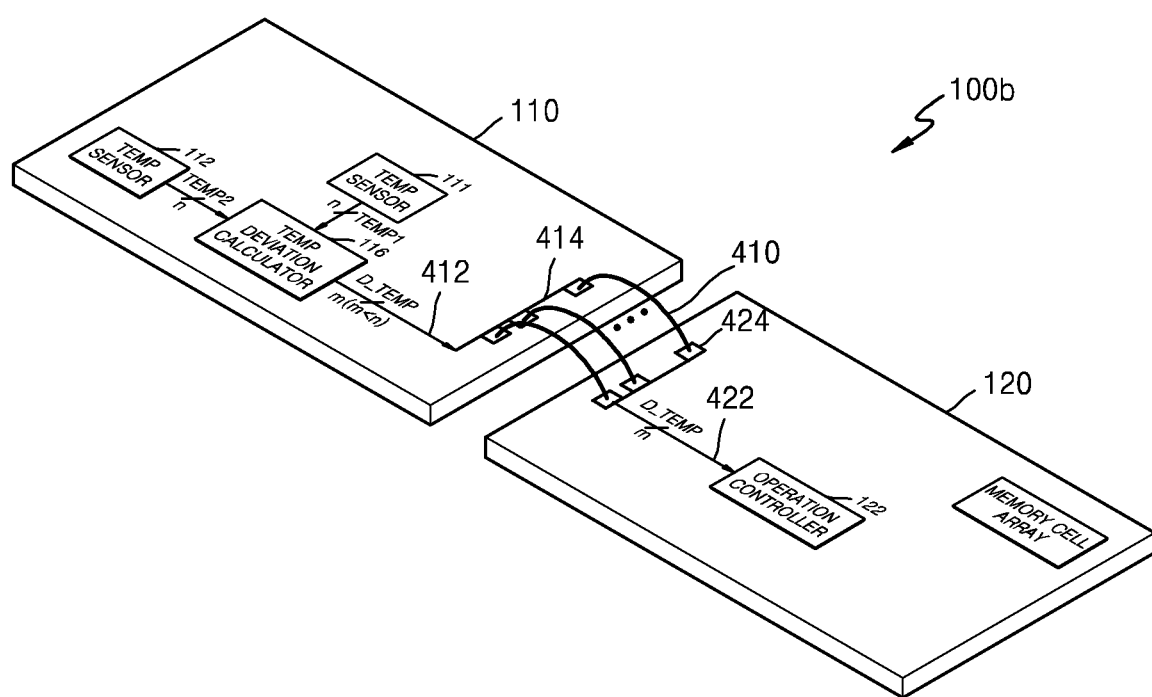
FIG. 4 is a perspective view in schematic form of a second example of a multi-chip package according to the inventive concept.

Referring to FIG. 4, the memory device 100b is a multi-chip package having a structure in which the first die 110 and the second die 120 are horizontally mounted on a base substrate (now shown). The memory device 100b is similar to the memory device 100a of FIG. 3 in that the temperature sensors 111 and 112 of the first die 110 of the memory device 100b generate the temperature information TEMP1 and TEMP2 corresponding to sensed temperature states, and the temperature deviation calculator 116 may calculate a temperature difference between the temperature information TEMP 1 and TEMP2 and output the temperature difference as deviation information D_TEMP. The temperature deviation calculator 116 may output the temperature deviation information D_TEMP of m (m<n) bits based on the temperature information TEMP1 and TEMP2 of n bits.

The temperature deviation information D_TEMP may be provided to the second die 120 by a signal path including m wire bonds 410. Each of the wire bonds 410 may provide an electrical connection by being connected to conductive lines 412 and 422 and conductive pads 414 and 424 of the first die 110 and the second die 120.

The second die 120 receives the temperature deviation information D_TEMP of the first die 110. The operation controller 122 of the second die 120 may control an operation of the second die 120 according to the temperature deviation information D_TEMP. For example, the operation controller 122 may control a refresh operation, a DC level, and/or an AC timing of the second die 120, according to the temperature deviation information D_TEMP.

Figure 5:
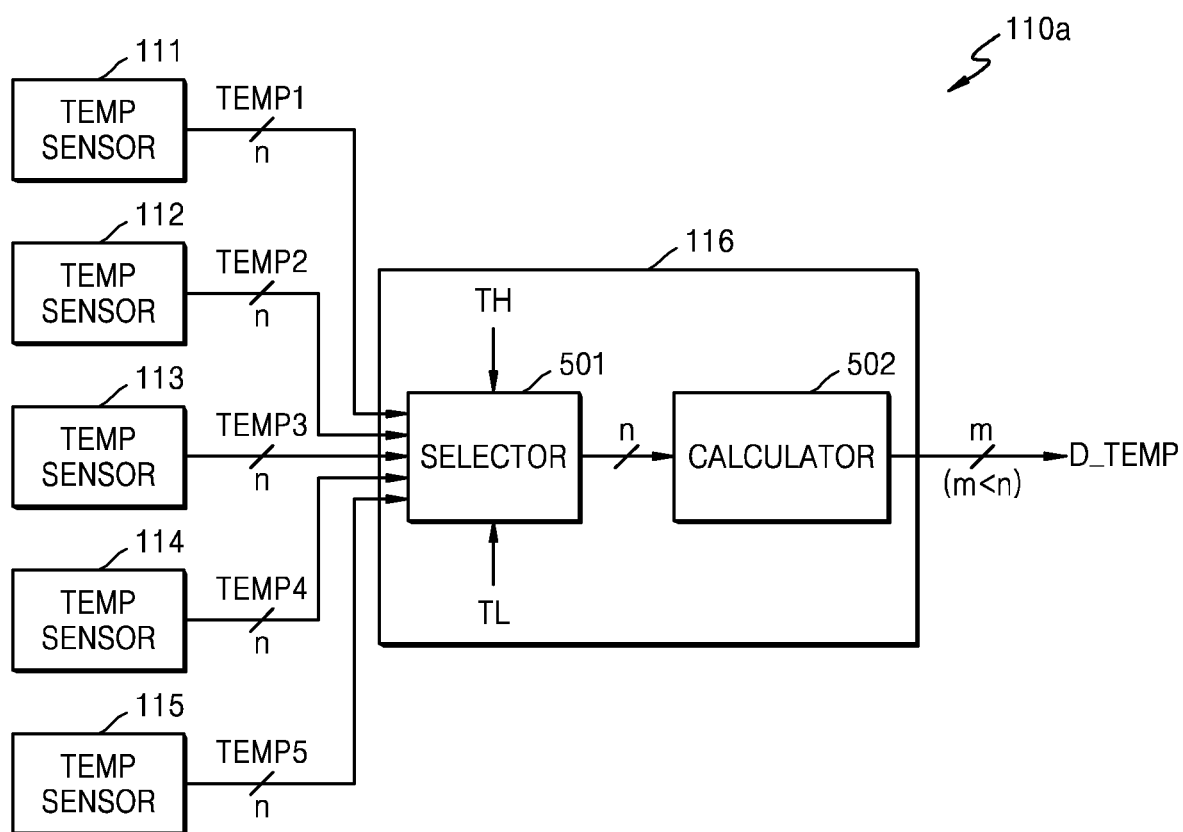
FIG. 5 is a block diagram of a portion of a first die of the memory device of FIG. 1.

FIG. 5 is a block diagram of a portion 110a of the first die 110 of the memory device 100 of FIG. 1.

Referring to FIG. 5, the first die 110 may include a plurality of temperature sensors 111 to 115 and the temperature deviation calculator 116. The temperature sensors 111 to 115 may sense temperatures of areas at which the temperature sensors 111 to 115 are disposed, and output the sensed temperatures as the temperature information TEMP1 to TEMP5. The temperature information TEMP1 to TEMP5 may be output as n bits.

The temperature deviation calculator 116 may receive the temperature information TEMP1 to TEMP5 of n bits from the temperature sensors 111 to 115, and calculate temperature differences among the temperature information TEMP1 to TEMP5. The temperature deviation calculator 116 may include a selection unit 501 responding to first and second selection signals TH and TL, and a calculator 502 outputting the temperature deviation information D_TEMP based on outputs of the selection unit 501.

In response to the first selection signal TH, the selection unit 501 may select a highest temperature from among the temperature information TEMP1 to TEMP5 and output the selected highest temperature to the calculator 502. In response to the second selection signal TL, the selection unit 501 may select a lowest temperature from among the temperature TEMP1 to TEMP5 and output the selected lowest temperature to the calculator 502. The calculator 502 may calculate a difference between the highest temperature and the lowest temperature, and thus output the temperature difference as the temperature deviation information D_TEMP of m (m<n) bits.

Figure 6:
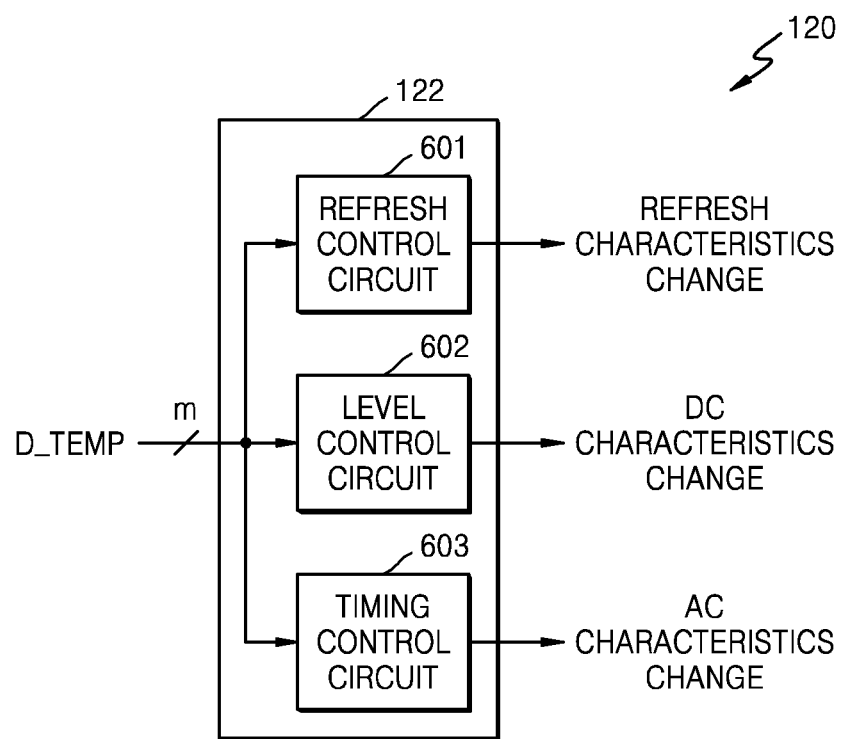
FIG. 6 is a block diagram of a portion of a second die of the memory device of FIG. 1.

FIG. 6 is a block diagram of a portion of the second die 120 of the memory device 100 of FIG. 1.

Referring to FIG. 6, the second die 120 may include the operation controller 122 receiving the temperature deviation information D_TEMP from the first die 110 of the memory device 100 of FIG. 1. The operation controller 122 may include a refresh control circuit 601, a level control circuit 602, and a timing control circuit 603 for controlling an operation of the second die 120 according to the temperature deviation information D_TEMP.

The refresh control circuit 601 may set a refresh characteristic of the second die 120 according to a temperature difference value represented by the temperature deviation information D_TEMP. For example, the ambient may be deemed to be at a high temperature when the temperature difference value due to a large value of the highest temperature. In this case, a refresh cycle may be set to be relatively short. On the other hand, the ambient may be deemed to be at a low temperature when the temperature difference is small, again, even though the highest temperature is used to calculate the temperature difference because the highest temperature will be relatively low. In any case, when the temperature difference value is small, the refresh cycle may be set to be long.

The level control circuit 602 may set one or more DC parameter characteristics, such as one or more of an operation voltage range, a reference voltage level, a strength of an output driver, light leveling, read leveling of the second die 120, according to the temperature deviation information D_TEMP. The operation voltage range and the reference voltage level may be set according to the temperature deviation information D_TEMP. The strength of the output driver may be provided as an enable or disable function of the output buffer. The light leveling and the read leveling may be provided to compensate for a skew between a clock and a data strobe.

The timing control circuit 603 may set one or more AC parameter characteristics, such as one or more of a clock latency, a command latency, a signal transfer latency, and a timing delay, according to the temperature deviation information D_TEMP. The clock latency may establish the clock cycle during which command/address receivers are enabled after commands are issued, according to the temperature deviation information D_TEMP. The command latency may establish a clock cycle delay between an internal command and a first bit of valid data. The signal transfer latency and the timing delay may be provided as a latency and a delay time which are set according to the temperature deviation information D_TEMP.

Figure 7:
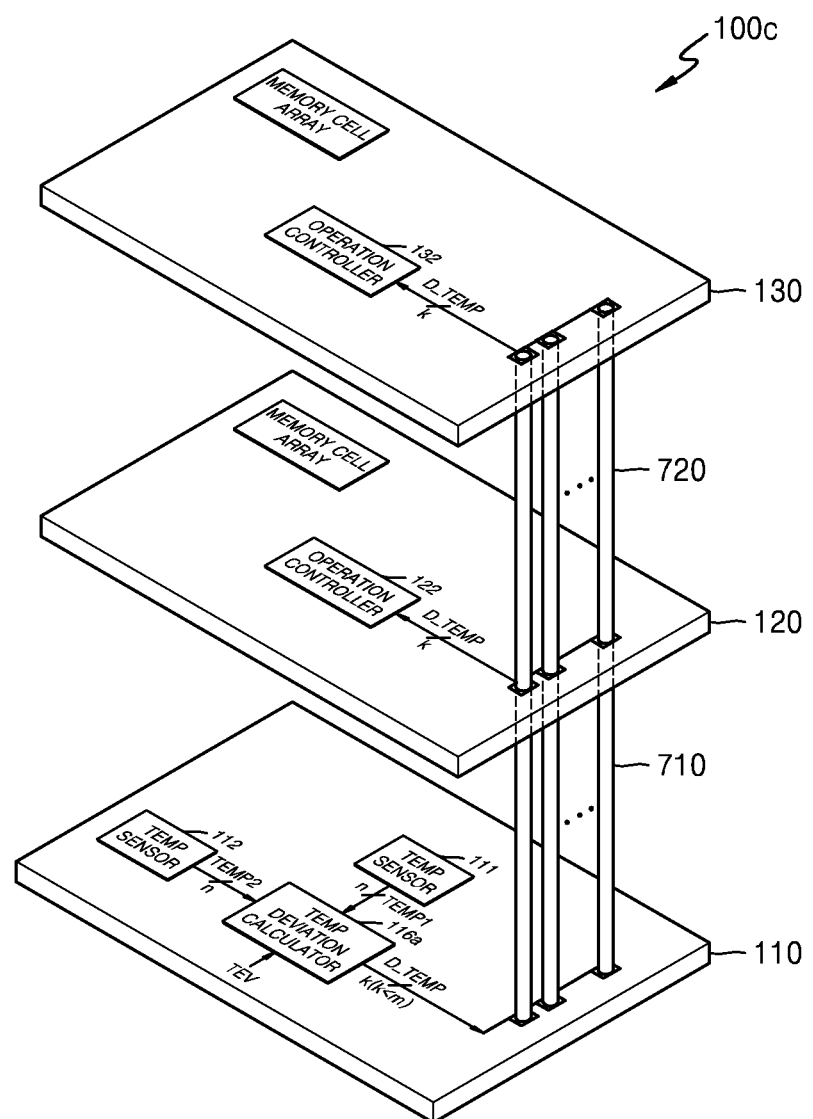
FIG. 7 is a perspective view in schematic form of a third example of a multi-chip package according to the inventive concept.

Referring next to FIG. 7, the memory device 100c may be a multi-chip package having a structure in which first through third dies 110 to 130 are vertically stacked. The memory device 100c is similar to the memory device 100a of FIG. 3 in that the first die 110 of the memory device 100c may be a logic die, and the second and third dies 120 and 130 may be memory dies.

The first die 110 may include the temperature sensors 111 and 112 and a temperature deviation calculator 116a. The temperature sensors 111 and 112 may generate the temperature information TEMP1 and TEMP2 corresponding to the sensed temperatures. The temperature deviation calculator 116a may calculate a temperature difference between the temperature information TEMP1 and TEMP2 output by the temperature sensors 111 and 112, and apply one or more temperature environment variables (TEVs) to the temperature difference and output the result as temperature deviation information D_TEMP.

The temperature environment variables TEV are constants or coefficients, for example, representative of structural characteristics of the multi-chip package. A temperature environment variable TEV may thus be heat transfer coefficient factoring in physical distances among the dies stacked in the multi-chip package. The temperature deviation calculator 116a may calculate and output the temperature deviation information D_TEMP of k (k<m) bits based on the temperature information TEMP1 and TEMP2 of n bits. The temperature deviation information D_TEMP may be provided to the second and third dies 120 and 130 via a signal path including k TSVs 710 and 720.

The second die 120 may include the operation controller 122 configured to receive the temperature deviation information D_TEMP of the first die 110 and control the operation of the second die 120 according to the temperature deviation information D_TEMP. The operation controller 122 may change a refresh operation, a DC level, and/or an AC timing of the second die 120, according to the temperature deviation information D_TEMP.

The third die 130 may include an operation controller 132 configured to receive the temperature deviation information D_TEMP of the first die 110 and control an operation of the third die 130 according to the temperature deviation information D_TEMP. The operation controller 132 may set a refresh operation, a DC level, and/or an AC timing of the third die 130, according to the temperature deviation information D_TEMP.

Figure 8:
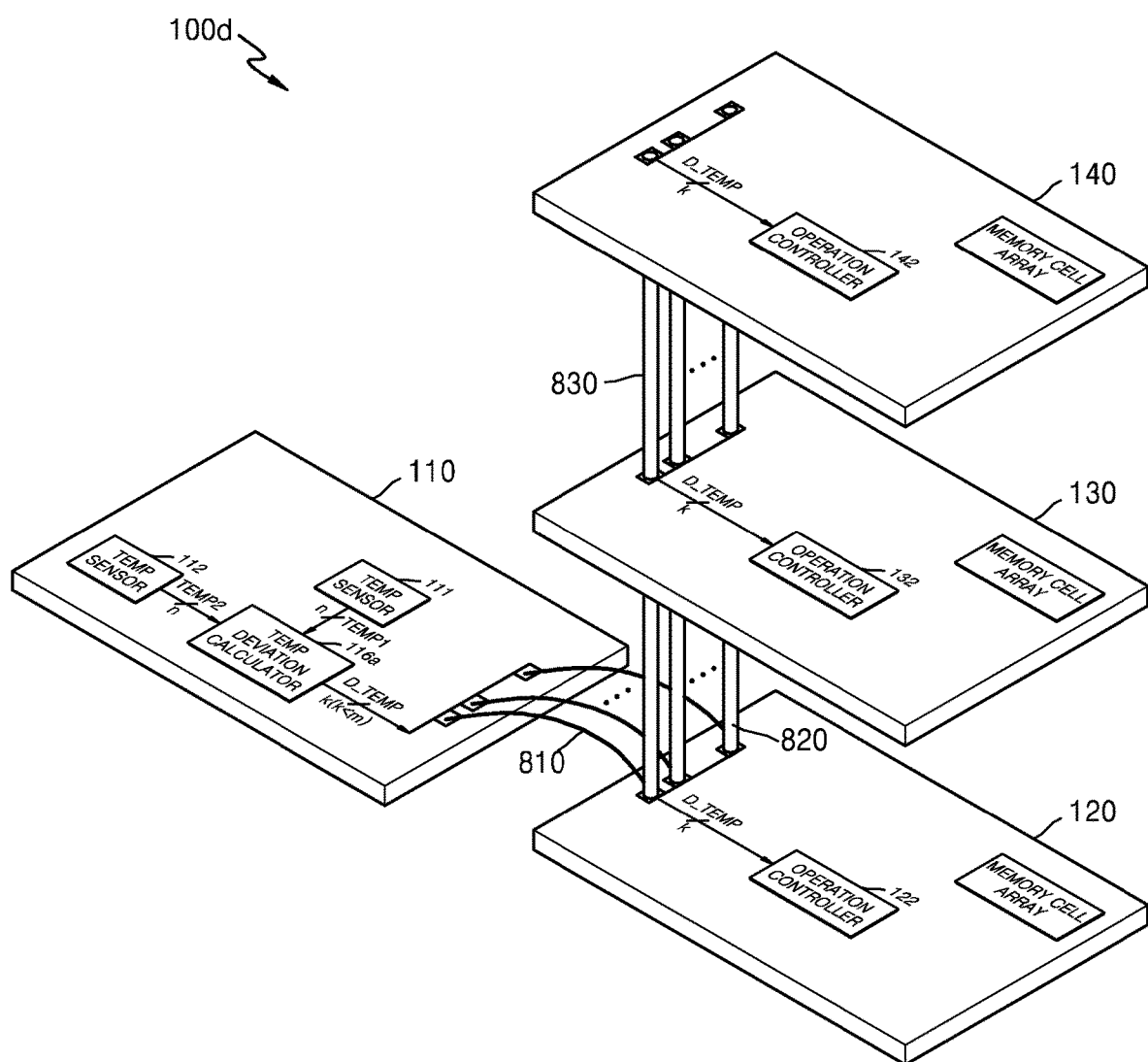
FIG. 8 is a perspective view in schematic form of a fourth example of multi-chip package according to the inventive concept.

Referring to FIG. 8, memory device 100d includes first through fourth dies 110 to 140, wherein the second through fourth dies 120 to 140 are stacked. The memory device 100d may be a multi-chip package having a structure in which the first die 110 and the stack of second through fourth dies 120 and 140 are horizontally arrayed, i.e., are disposed laterally as mounted to a base substrate (not shown). The first die 110 of the memory device 100d may be a logic die, and the second through fourth dies 120 to 140 may be memory dies. In this example, the second die 120 is an interface die between the first die 110 and the third die 130.

The memory device 100d is similar to the memory device 100c of FIG. 7 in that the first die 110 of the memory device 100d, the temperature sensors 111 and 112 may generate the temperature information TEMP1 and TEMP2 corresponding to the sensed temperatures, and the temperature deviation calculator 116a may calculate a temperature difference between the temperature information TEMP1 and TEMP2 of the temperature sensors 111 and 112 and output the temperature deviation information D_TEMP. The temperature deviation calculator 116a may factor in one or more temperature environment variables TEVs in calculating the temperature deviation information D_TEMP. The temperature deviation calculator 116a may calculate and output the temperature deviation information D_TEMP of k (k<m) bits based on the temperature information TEMP1 and TEMP2 of n bits. The temperature deviation information D_TEMP may be provided to the second die 120 along a signal path including k wire bonds 810.

The second die 120 may include the operation controller 122 configured to receive the temperature deviation information D_TEMP of the first die 110 and set a refresh operation, a DC level, and/or an AC timing of the second die 120, according to the temperature deviation information D_TEMP. The second die 120 may provide the received temperature deviation information D_TEMP of the first die 110 to the third and fourth dies 130 and 140 via a signal path including TSVs 820 and 830.

In an example in which the second die 120 functions only as an interface, the second die 120 may perform only a function of providing a signal to the third die 130, as opposed to some internal function that needs to be controlled.

The third die 130 may include the operation controller 132 configured to receive the temperature deviation information D_TEMP of the first die 110 and set a refresh operation, a DC level, and/or an AC timing of the third die 130, according to the temperature deviation information D_TEMP. The fourth die 140 may include an operation controller 142 configured to receive the temperature deviation information D_TEMP of the first die 110 and set a refresh operation, a DC level, and/or an AC timing of the fourth die 140, according to the temperature deviation information D_TEMP.

Figure 9:
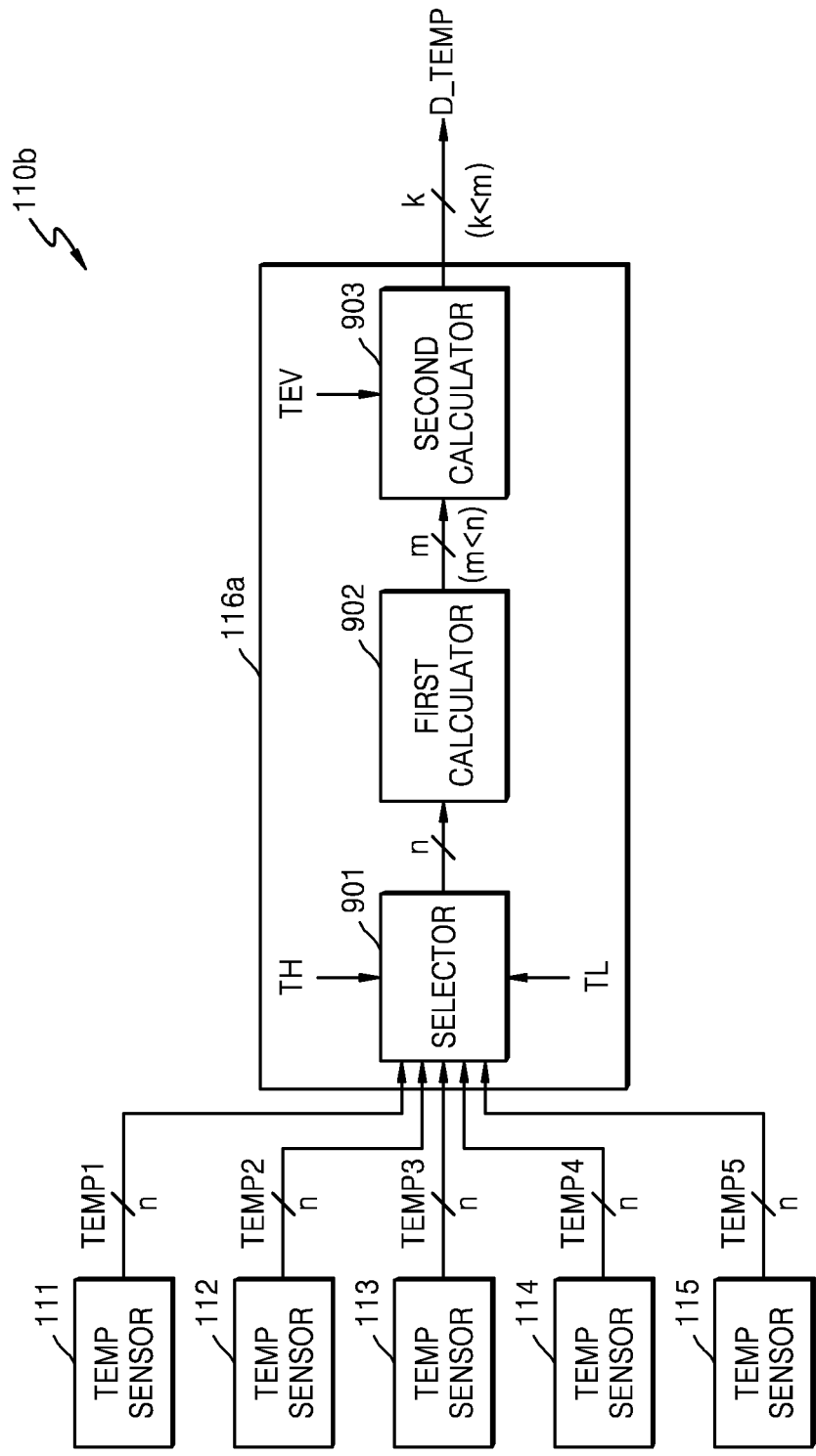
FIG. 9 is a block diagram of a portion of a first die of the multi-chip packages of FIGS. 7 and 8.

FIG. 9 is a block diagram of a portion 110b of the first die 110 of the memory devices 100c and 100d of FIGS. 7 and 8.

Referring to FIG. 9, the first die 110 may include a plurality of temperature sensors 111 to 115 and the temperature deviation calculator 116a. The temperature sensors 111 to 115 may sense temperatures of areas at which the temperature sensors 111 to 115 are located, and output the sensed temperatures as the temperature information TEMP1 to TEMP5. The temperature information TEMP1 to TEMP5 may be output as n bits of information.

The temperature deviation calculator 116a may receive the temperature information TEMP1 to TEMP5 of n bits from the temperature sensors 111 to 115, calculate a temperature difference using the temperature information TEMP1 to TEMP5, factor a temperature environment variable(s) TEV into the calculated temperature difference, and output the result as the temperature deviation information D_TEMP. The temperature environment variable(s) TEVs is/are heat transfer coefficients corresponding to physical distances between the dies stacked in the multi-chip package, and is/are generally values less than 1. The temperature environment variables TEVs decrease in value as the distances among the stacked dies become greater. In one example, an average of the heat transfer coefficients is used as the temperature environment variable TEV.

The temperature deviation calculator 116a may include a selection unit 901 and first and second calculators 902 and 903. The selection unit 901 may output selected temperature information from among the temperature information TEMP1 to TEMP5 via the first calculator 902, in response to first and second selection signals TH and TL. In response to the first selection signal TH, the selection unit 901 may select a highest temperature from among the temperature information TEMP1 to TEMP5 of n bits and output the highest temperature via the first calculator 902, and in response to the second selection signal TL, the selection unit 901 may select a lowest temperature from among the temperature information TEMP1 to TEMP5 and output the lowest temperature via the first calculator 902.

The first calculator 902 may calculate a temperature difference based on the outputs of the selection unit 901 and output the calculated temperature difference via the second calculator 903. The first calculator 902 may calculate a difference between the highest temperature and the lowest temperature from among the temperature information TEMP1 to TEMP5 and output the temperature difference of m (m<n) bits.

The second calculator 903 may factor the temperature environment variable TEV into the temperature deviation information D_TEMP output by the first calculator 902. The second calculator 903 may perform a calculation of multiplying the temperature difference of m bits by the temperature environment variable TEV to output the temperature deviation information D_TEMP of k (k<m) bits. The temperature deviation information D_TEMP may be formed of k bits, the k bits being less than the n bits of the temperature information TEMP1 to TEMP5.

Figure 10:
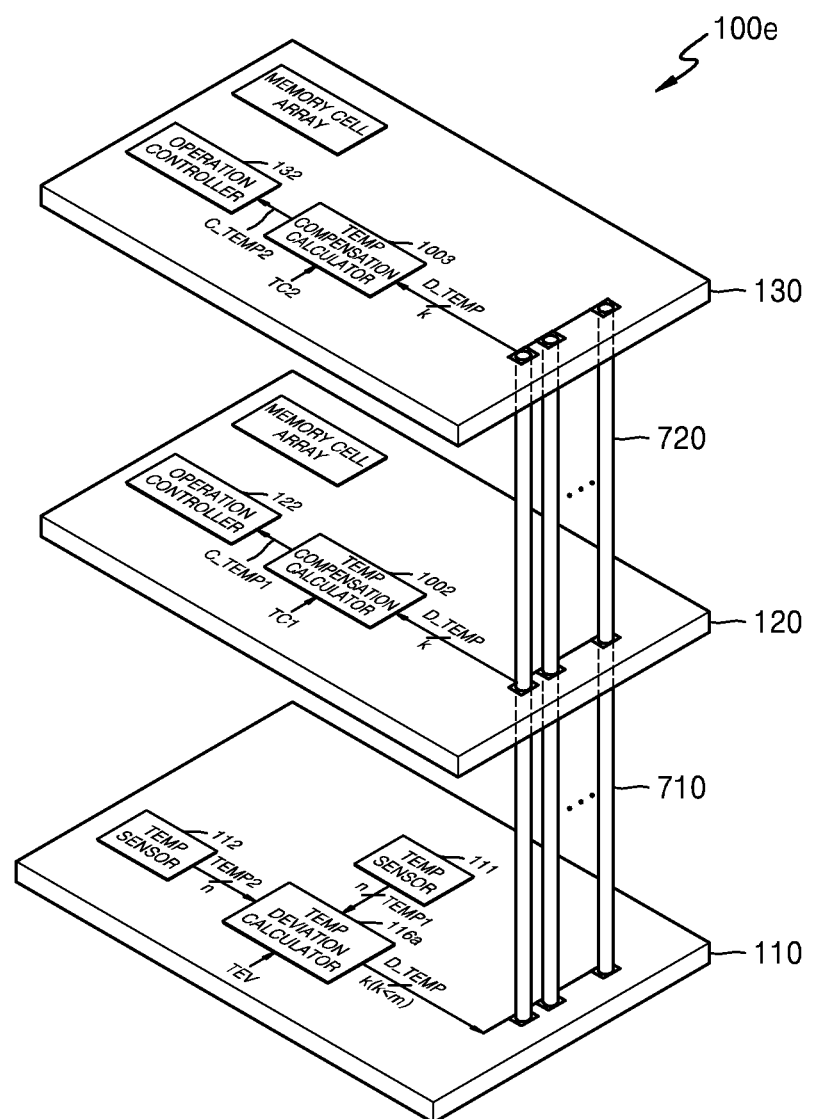
FIG. 10 is a perspective view in schematic form of a fifth example of multi-chip package according to the inventive concept.

Referring now to FIG. 10, in this example of a multi-chip package the memory device 100e has vertically stacked first through third dies 110 through 130 similarly to the memory device 100c of FIG. 7.

The first die 110 may include the temperature sensors 111 and 112 and the temperature deviation calculator 116a. The temperature sensors 111 and 112 may generate the temperature information TEMP1 and TEMP2. The temperature deviation calculator 116a may output the temperature deviation information D_TEMP by factoring the temperature environment variable TEV into the temperature difference between the temperature information TEMP1 and TEMP2 produced by the temperature sensors 111 and 112. The temperature deviation calculator 116a may output the temperature deviation information D_TEMP of k (k<m) bits based on the temperature information TEMP1 and TEMP2 of n bits. The temperature deviation information D_TEMP may be provided to the second and third dies 120 and 130 via k TSVs 710 and 720.

The second die 120 may include a temperature compensation calculator 1002 configured to receive the temperature deviation information D_TEMP from the first die 110, and the operation controller 122 configured to control an operation of the second die 120 according to an output of the temperature compensation calculator 1002. The temperature compensation calculator 1002 may output temperature compensation information C_TEMP1 which is generated by factoring a first temperature compensation coefficient TC1 of the second die 120 into the temperature deviation information D_TEMP produced by the first die 110. The first temperature compensation coefficient TC1 may comprise a heat transfer coefficient based on the physical distance between the first die 110 and the second 120, or a temperature difference fixed between the first die 110 and the second die 120 owing to structural characteristics of the packaged dies.

The temperature compensation calculator 1002 may output the temperature compensation information C_TEMP1 representative of a temperature which is lower by a predetermined amount than a temperature of the first die 110. For example, the temperature compensation information C_TEMP1 may represent a temperature which is 4° C. lower than the temperature of the first die 110. The operation controller 122 may set a refresh operation, a DC level, and/or an AC timing of the second die 120 according to the temperature compensation information C_TEMP1.

The third die 130 may include a temperature compensation calculator 1003 configured to receive the temperature deviation information D_TEMP of the first die 110, and the operation controller 132 configured to control an operation of the third die 130 according to an output of the temperature compensation calculator 1003. The temperature compensation calculator 1003 may output temperature compensation information C_TEMP2 that factors a second temperature compensation coefficient TC2 of the third die 130 into the temperature deviation information D_TEMP output by the first die 110. The second temperature compensation coefficient TC2 may include a heat transfer coefficient based on a physical distance between the first die 110 and the third 130, or a temperature difference fixed between the first die 110 and the third die 130 owing to structural characteristics of the packaged dies.

The temperature compensation calculator 1003 may output the temperature compensation information C_TEMP2 representative of a temperature which is lower by a predetermined amount than the temperature of the first die 110. For example, the temperature compensation calculator 1003 may output the temperature compensation information C_TEMP1 representative of a temperature which is 6° C. lower than the temperature of the first die 110. The operation controller 132 may change a refresh operation, a DC level, and/or an AC timing of the third die 130 according to the temperature compensation information C_TEMP2.

Figure 11:
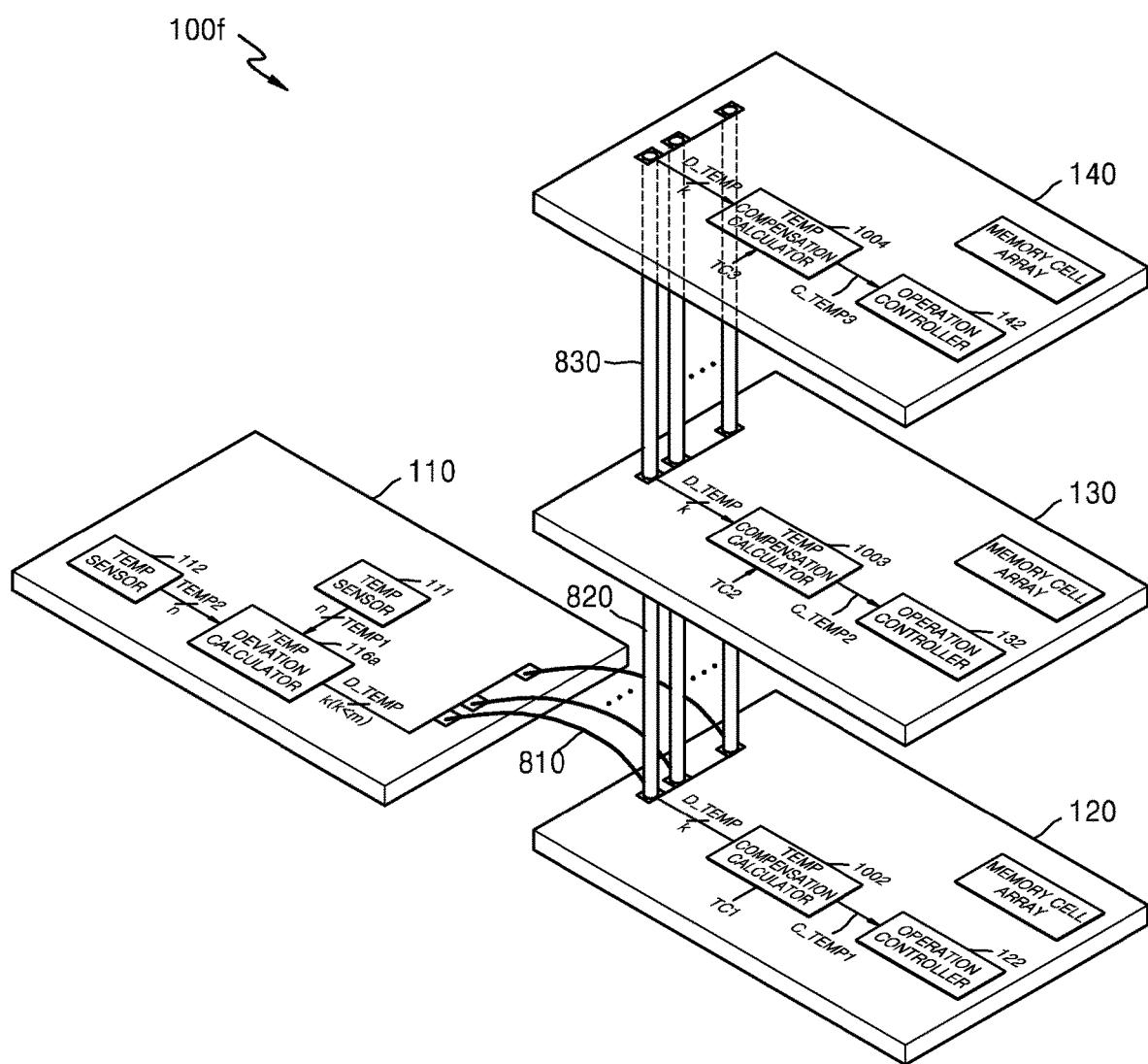
FIG. 11 is a perspective view in schematic form of a sixth example of multi-chip package according to the inventive concept.

Referring next to FIG. 11, memory device 100f of a multi-chip package according to the inventive concept includes first through fourth dies 110 through 140, wherein the second through fourth dies 120 through 140 are stacked. The memory device 100f may have a structure in which the first die 110, and the stacked second through fourth dies 120 and 140 are horizontally mounted on a base substrate (now shown).

The memory device 100f is similar to the memory device 100e of FIG. 10 in that the first die 110 of the memory device 100f may output the temperature deviation information D_TEMP reflecting a temperature environment variable TEV in a temperature difference between the temperature information TEMP1 and TEMP2 of the temperature sensors 111 and 112. The temperature deviation calculator 116a may output the temperature deviation information D_TEMP of k (k<m) bits based on the temperature information TEMP1 and TEMP2 of n bits. The temperature deviation information D_TEMP of the first die 110 may be provided to the second through fourth dies 120 through 140 by a signal path of k wire bonds 810.

The second die 120 may include the temperature compensation calculator 1002 configured to output the first temperature compensation information C_TEMP1 which reflects the first temperature compensation coefficient TC1 of the second die 120 in the temperature deviation information D_TEMP of the first die 110, and the operation controller 122 configured to set a refresh operation, a DC level, and/or an AC timing of the second die 120 according to the first temperature compensation information C_TEMP1.

The third die 130 may include the temperature compensation calculator 1003 configured to output the second temperature compensation information C_TEMP2 which reflects the second temperature compensation coefficient TC2 of the third die 130 in the temperature deviation information D_TEMP of the first die 110, and the operation controller 132 configured to set a refresh operation, a DC level, and/or an AC timing of the third die 130 according to the second temperature compensation information C_TEMP2.

The fourth die 140 may include a temperature compensation calculator 1004 configured to output third temperature compensation information C_TEMP3 which is generated by reflecting a third temperature compensation coefficient TC3 of the fourth die 140 in the temperature deviation information D_TEMP of the first die 110, and the operation controller 142 configured to set a refresh operation, a DC level, and/or an AC timing of the fourth die 140 according to the third temperature compensation information C_TEMP3.

Figure 12:
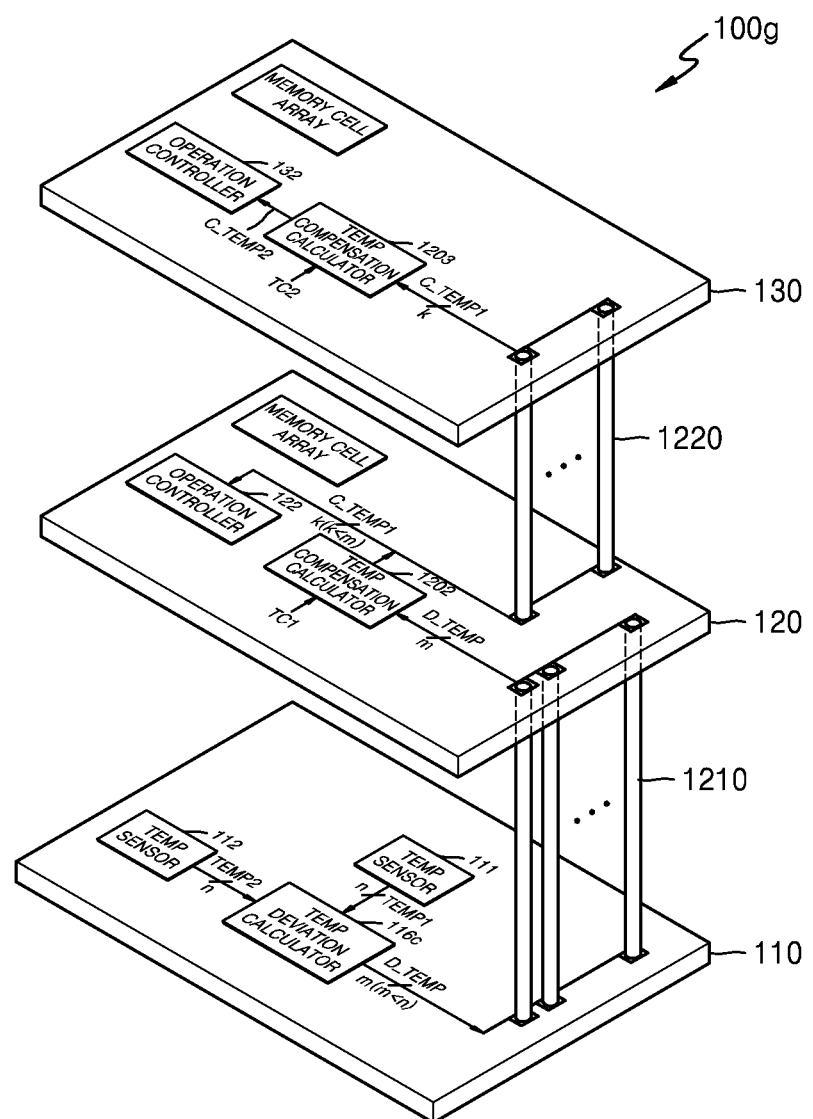
FIG. 12 is a perspective view in schematic form of a seventh example of multi-chip package according to the inventive concept.

Referring next to FIG. 12, memory device 100g of a multi-chip package according to the inventive concept may have a structure in which the first through third dies 110 through 130 are vertically stacked similarly to the example of FIG. 10.

The first die 110, the temperature sensors 111 and 112 may generate the temperature information TEMP1 and TEMP2 of n bits, and the temperature deviation calculator 116 may output the difference between the temperature information TEMP1 and TEMP2 of the temperature sensors 111 and 112 as the temperature deviation information D_TEMP of m (m<n) bits. The temperature deviation information D_TEMP may be provided to the second die 120 via m TSVs 1210.

The second die 120 may include a first temperature compensation calculator 1202 configured to generate the first temperature compensation information C_TEMP1 based on the temperature deviation information D_TEMP of the first die 110, and the operation controller 122 configured to control the operation of the second die 120 according to the first temperature compensation information C_TEMP1. The first temperature compensation calculator 1202 may calculate the first temperature compensation information C_TEMP1 by factoring the first temperature compensation coefficient TC1 of the second die 120 into the temperature deviation information D_TEMP output by the first die 110. The first temperature compensation coefficient TC1 may comprise a heat transfer coefficient based on the physical distance between the first die 110 and the second die 120, or a temperature difference fixed between the first die 110 and the second die 120 owing to structural characteristics of the packaged dies.

The first temperature compensation calculator 1002 may output the first temperature compensation information C_TEMP1 representative of a temperature which is lower than a temperature of the first die 110 by a predetermined amount. For example, the first temperature compensation calculator 1002 may output the first temperature compensation information C_TEMP1 representative of a temperature which is 4° C. less than the temperature of the first die 110. The operation controller 122 may change a refresh operation, a DC level, and/or an AC timing of the second die 120 according to the first temperature compensation information C_TEMP1. The first temperature compensation information C_TEMP1 of the first temperature compensation calculator 1202 may be provided to the third die 130 via a signal path of k (k<m) TSVs 1220.

The third die 130 may include a second temperature compensation calculator 1203 configured to generate the second temperature compensation information C_TEMP2 based on the first temperature compensation information C_TEMP1 of the second die 120, and the operation controller 132 configured to control the operation of the third die 130 according to the second temperature compensation information C_TEMP2. The second temperature compensation calculator 1203 may calculate the second temperature compensation information C_TEMP2 by factoring the second temperature compensation coefficient TC2 of the third die 130 into the first temperature compensation information C_TEMP1 output by the second die 120. The second temperature compensation coefficient TC2 may comprise a heat transfer coefficient based on a physical distance between the second die 120 and the third die 130, or a temperature difference between the second die 120 and the second die 130 fixed due to structural characteristics of the packaged dies.

The second temperature compensation calculator 1203 may output the second temperature compensation information C_TEMP2 representative of a temperature which is lower than a temperature of the second die 120 by a predetermined amount. For example, the second temperature compensation calculator 1203 may output second temperature compensation information C_TEMP2 representative of a temperature which is 2° C. is lower than the temperature of the second die 120. The operation controller 132 may set a refresh operation, a DC level, and/or an AC timing of the third die 130, according to the second temperature compensation information C_TEMP2.

Figure 13:
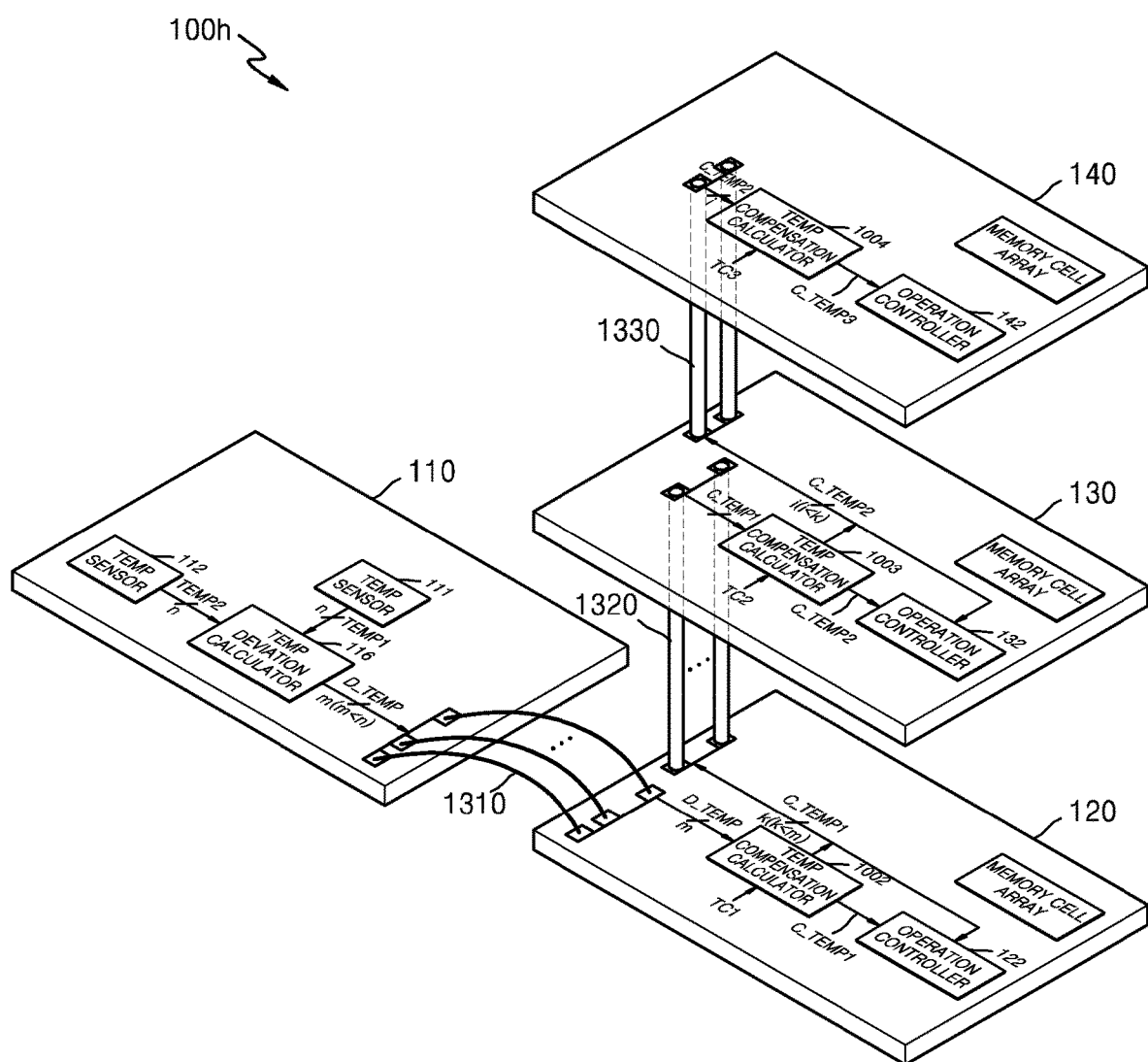
FIG. 13 is a perspective view in schematic form of a eighth example of multi-chip package according to the inventive concept.

Referring next to FIG. 13, memory device 100h of a multi-chip package according to the inventive concept includes the first through fourth dies 110 through 140, wherein the second through fourth dies 120 through 140 are stacked. The memory device 100h may have a structure in which the first die 110, and the stacked second through fourth dies 120 through 140 are horizontally mounted.

Similarly to the memory device 100g of FIG. 12, the first die 110 of the memory device 100h may output a temperature difference between the temperature information TEMP1 and TEMP2 of the temperature sensors 111 and 112 as the temperature deviation information D_TEMP. The temperature deviation calculator 116 may output the temperature deviation information D_TEMP of m (m<n) bits based on the temperature information TEMP1 and TEMP2 of n bits. The temperature deviation information D_TEMP may be provided to the second die 120 via a signal path of m wire bonds 1310.

The second die 120 may include the first temperature compensation calculator 1202 generating the first temperature compensation information C_TEMP1 based on the temperature deviation information D_TEMP of the first die 110, and the operation controller 122 controlling an operation of the second die 120 according to the first temperature compensation information C_TEMP1. The first temperature compensation calculator 1202 may output the first temperature compensation information C_TEMP1 of k (k<m) bits representative of a temperature which is lower by a predetermined amount than the temperature of the first die 110. The temperature compensation information C_TEMP1 factors the first temperature compensation coefficient TC1 of the second die 120 into the temperature deviation information D_TEMP of m bits. The operation controller 122 may set a refresh operation, a DC level, and/or an AC timing of the second die 120 according to the first temperature compensation information C_TEMP1. The first temperature compensation information C_TEMP1 of the first temperature compensation calculator 1202 may be provided to the third die 130 via a signal path of k (k<m) TSVs 1320.

The third die 130 may include the second temperature compensation calculator 1203 generating the second temperature compensation information C_TEMP2 based on the first temperature compensation information C_TEMP1 of the second die 120, and the operation controller 132 controlling an operation of the third die 130 according to the second temperature compensation information C_TEMP2. The second temperature compensation calculator 1203 may output the second temperature compensation information C_TEMP2 of i (i<k) bits representative of a temperature which is lower by a predetermined degree than the temperature of the second die 120. The second temperature compensation information C_TEMP2 is calculated by factoring the second temperature compensation coefficient TC2 of the third die 130 into the first temperature compensation information C_TEMP1 of k bits. The operation controller 132 may set a refresh operation, a DC level, and/or an AC timing of the third die 130 according to the second temperature compensation information C_TEMP2. The second temperature compensation information C_TEMP2 of the temperature compensation calculator 1203 may be provided to the fourth die 140 via i TSVs 1330.

The fourth die 140 may include a third temperature compensation calculator 1204 generating the third temperature compensation information C_TEMP3 by reflecting the third temperature compensation coefficient TC3 of the fourth die 140 in the second temperature compensation information C_TEMP2 of the third die 130, and the operation controller 142 controlling an operation of the fourth die 140 according to the third temperature compensation information C_TEMP3. The third temperature compensation calculator 1204 may output the third temperature compensation information C_TEMP3 indicating a temperature which is lower by a predetermined degree than a temperature of the third die 130, by reflecting the third temperature compensation coefficient TC3 of the fourth die 140 in the second temperature compensation information C_TEMP2 of i bits. The operation controller 142 may change a refresh operation, a DC level, and/or an AC timing of the fourth die 140, according to the third temperature compensation information C_TEMP3.

Figure 14:
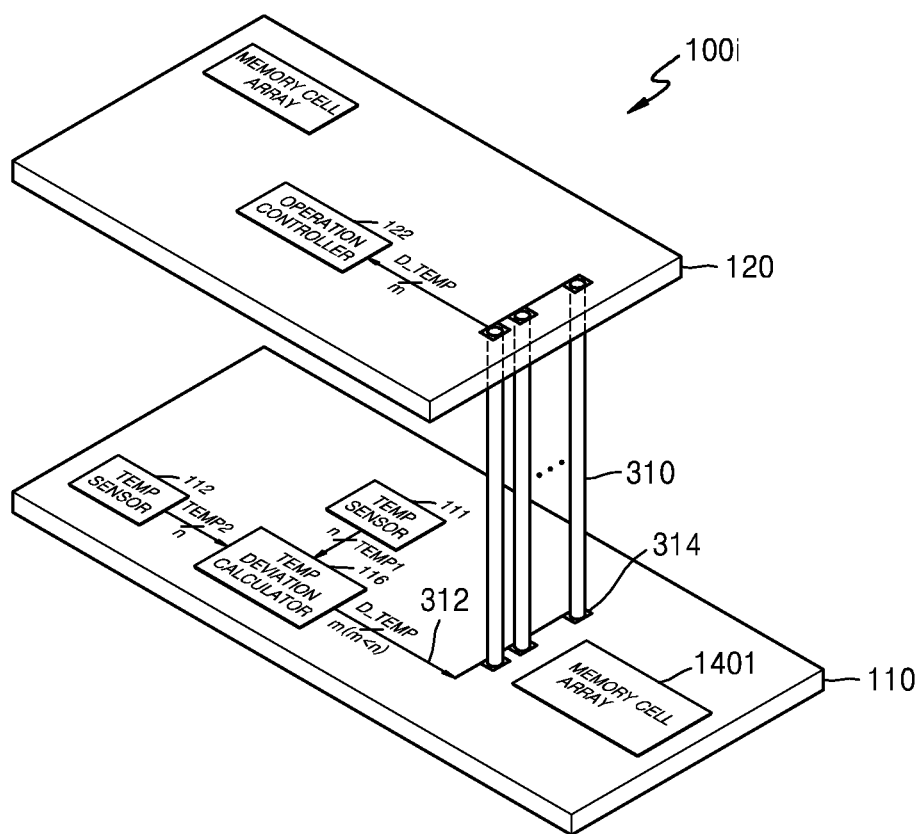
FIG. 14 is a perspective view in schematic form of a ninth example of multi-chip package according to the inventive concept.

Referring next to FIG. 14 memory device 100i of a multi-chip package according to the inventive concept may have a structure in which the first die 110 and the second die 120 are vertically stacked.

The memory device 100i is similar to the memory device 100a of FIG. 3 except that the first die 110 of memory device 100i further includes a memory cell array 1401. The first die 110 of the memory device 100i may perform a logic function, as well as a memory function, whereas the second (memory) die 120 performs only a memory function in this example.

In the first die 110, the temperature sensors 111 and 112 may sense temperature states relevant to the operation of the memory cell array 1401, and may generate the temperature information TEMP1 and TEMP2 corresponding to the sensed temperature states. The temperature deviation calculator 116 may output a temperature difference between the temperature information TEMP1 and TEMP2 of the temperature sensors 111 and 112 as the temperature deviation information D_TEMP. The temperature deviation calculator 116 may output the temperature deviation information D_TEMP of m (m<n) bits based on the temperature information TEMP1 and TEMP2 of n bits. The temperature deviation information D_TEMP may be provided to the second die 120 via m TSVs 310.

In this example, also, the temperature deviation calculator 116 may calculate the temperature deviation information D_TEMP of k (k<m) bits by factoring a temperature environment variable TEV into the temperature difference between the temperature information TEMP1 and TEMP of n bits of the temperature sensors 111 and 112. The temperature deviation information D_TEMP may be provided to the second die 120 via k TSVs.

The second die 120 may include the operation controller 122 configured to receive the temperature deviation information D_TEMP of the first die 110 and control an operation of the second die 120 according to the temperature deviation information D_TEMP. The operation controller 122 may change a refresh operation, a DC level, and/or an AC timing of the second die 120 according to the temperature deviation information D_TEMP.

Figure 15:
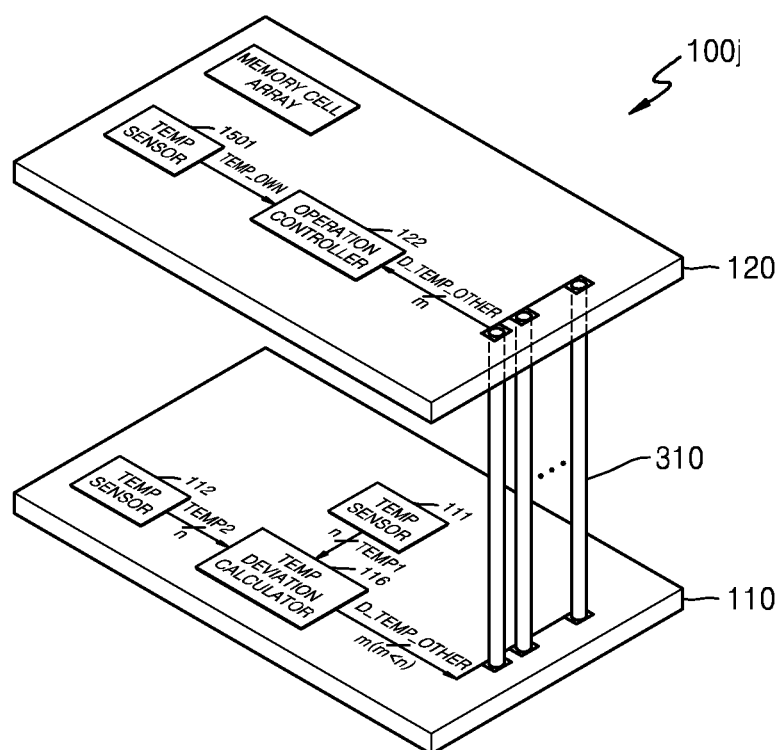
FIG. 15 is a perspective view in schematic form of a tenth example of multi-chip package according to the inventive concept.

Referring next to FIG. 15, memory device 100j of a multi-chip package according to the inventive concept may have a structure in which the first die 110 and the second die 120 are vertically stacked.

The memory device 100j is similar to the memory device 100a of FIG. 3 except that the second die 120 of the memory device 100j further includes at least one temperature sensor 1501.

In the first die 110, the temperature sensors 111 and 112 may sense temperature states and generate the temperature information TEMP1 and TEMP2 corresponding to the sensed temperature states. A temperature deviation calculator 116b may output a temperature difference between the temperature information TEMP1 and TEMP2 of the temperature sensors 111 and 112 as first temperature deviation information D_TEMP_OTHER. The temperature deviation calculator 116b may output the first temperature deviation information D_TEMP_OTHER of m (m<n) bits based on the temperature information TEMP1 and TEMP2 of n bits. The first temperature deviation information D_TEMP_OTHER may be provided to the second die 120 via m TSVs 310.

The temperature sensor 1501 of the second die 120 may occupy a specific area of the second die 120. For example, the temperature sensor 1501 of the second die 120 may be disposed near an area at which the first temperature sensor 111 of the first die 110 is disposed. Thus, the first temperature sensor 111 of the first die 110 and the temperature sensor 1501 of the second die 120 may be arranged to sense a temperature of the same area in the memory device 100j. The first temperature sensor 111 of the first die 110, which is located in the same area as the temperature sensor 1501 of the second die 120, may serve as a reference temperature sensor.

The second die 120 may include the temperature sensor 1501, the memory cell array 121, and the operation controller 122. The temperature sensor 1501 may sense a temperature state of the second die 120 and generate temperature information TEMP_OWN corresponding to the sensed temperature state. The sense temperature state may be relevant to an operation of the memory cell array 121, i.e., the temperature sensed by the temperature sensor 1501 may impact the operation of the memory cell array 121.

The operation controller 122 of the second die 120 may receive the temperature information TEMP_OWN of the temperature sensor 1501 and the temperature deviation information D_TEMP of the first die 110, and may control the operation of the second die 120 according to the temperature information TEMP_OWN and the temperature deviation information D_TEMP. The operation controller 122 may set a refresh operation, a DC level, and/or an AC timing of the second die 120 by reflecting the temperature deviation information D_TEMP in the temperature information TEMP_OWN.

Although the memory device 100j has been shown and described as having one second die 120 having a temperature sensor which senses a temperature state of the die, the memory device 100j may have a plurality of second dies 120 stacked on the first die 110.

Figure 16:
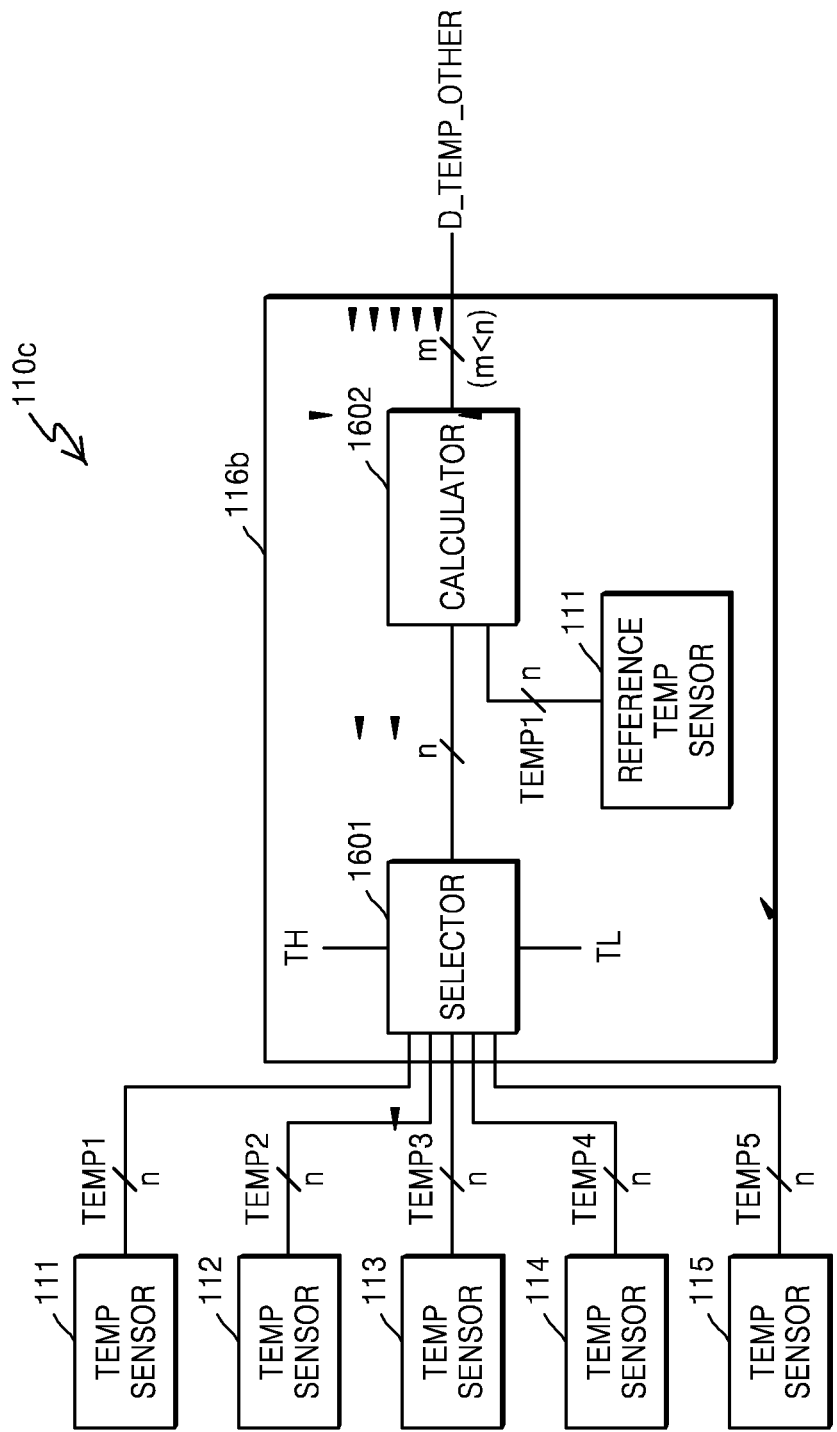
FIG. 16 is a block diagram of a portion of a first die of the multi-chip package of FIG. 15.

FIG. 16 is a block diagram of a portion 110c of the first die 110 of another example of the memory device 100j of FIG. 15.

Referring to FIG. 16, the first die 110 may include a plurality of temperature sensors 111 through 115, and a temperature deviation calculator 116b. The temperature sensors 111 through 115 may sense temperature states of areas occupied by the temperature sensors 111 through 115, and generate the sensed temperature states as temperature information TEMP1 through TEMP5. The temperature information TEMP1 through TEMP5 may output the sensed temperature states as n bits.

The temperature deviation calculator 116b may receive the temperature information TEMP1 through TEMP5 of n bits from the temperature sensors 111 through 115, and may calculate a temperature difference between the temperature information TEMP1 through TEMP5 and the reference temperature TEMPE The temperature deviation calculator 116b may include a selection unit 1601 responding to first and second selection signals TH and TL, and a calculator 1602 outputting the first temperature deviation information D_TEMP_OHTER based on the output of the selection unit 1601 and the temperature information TEMP1 of the reference temperature sensor 111. The reference temperature sensor 111 and the temperature sensor 1501 of the second die (120 of FIG. 15) may be set to sense the temperature of substantially the same area in the memory device 110j.

The selection unit 1601 may select a highest temperature from among the temperature information TEMP1 through TEMP5 and output the highest temperature via the calculator 502, in response to the first selection signal TH, and may select a lowest temperature from among the temperature information TEMP1 through TEMP5 and output the lowest temperature via the calculator 1602, in response to the second selection signal TL. The calculator 1602 may calculate a difference between the highest temperature and the reference temperature TEMP1 and output the temperature difference as the first temperature deviation information D_TEMP_OTHER of m (m<n) bits. The calculator 1602 may calculate a difference between the lowest temperature and the reference temperature TEMP1 and output the temperature difference as the first temperature deviation information D_TEMP_OTHER of m (m<n) bits. The first temperature deviation information D_TEMP_OTHER may be calculated using the lowest of the temperatures from among those represented by temperature information TEMP1 through TEMP5 of n bits.

Figure 17:
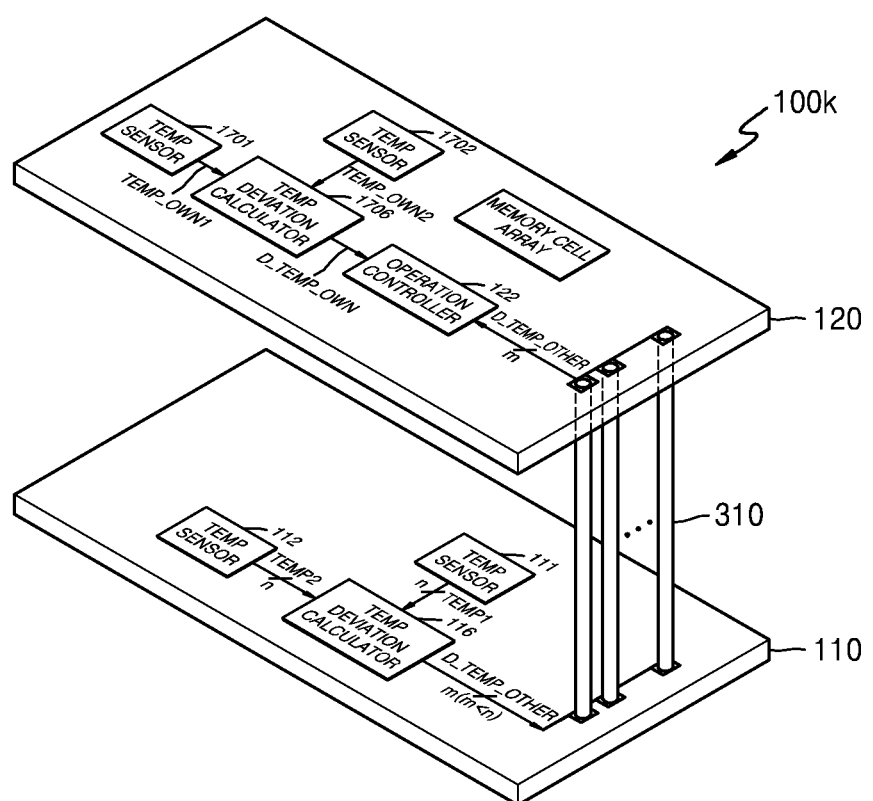
FIG. 17 is a perspective view in schematic form of a eleventh example of multi-chip package according to the inventive concept.

Referring next to FIG. 17, memory device 100k of a multi-chip package according to the inventive concept may have a structure in which the first die 110 and the second die 120 are vertically stacked.

The memory device 100k is similar to the memory device 100j of FIG. 15 except that the second die 120 of the memory device 100k includes a plurality of second temperature sensors and a second temperature deviation calculator 1706. An example will be described in which the second die 110 includes two temperature sensors 1701 and 1702, but the second die 110 may include more than two temperature sensors.

The second temperature sensors 1701 and 1702 may sense temperatures of the second die 120, and generate temperature information TEMP_OWN1 and TEMP_OWN2 corresponding to a temperature state of the second die.

The second temperature deviation calculator 1706 may receive the temperature information TEMP_OWN1 and TEMP_OWN2 of the second temperature sensors 1701 and 1702 and may calculate and output the second temperature deviation information D_TEMP_OWN. The second temperature deviation information D_TEMP_OWN may be a difference between the temperatures represented by the temperature information TEMP_OWN1 and TEMP_OWN2. The second temperature deviation information D_TEMP_OWN of the second temperature deviation calculator 1706 is transferred to the operation controller 122.

The operation controller 122 may receive the first temperature deviation information D_TEMP of the first die 110 and the second temperature deviation information D_TEMP_OWN of the second die 120, and may control the operation of the second die 120 according to the first and second temperature deviation information D_TEMP_OTHER and D_TEMP_OWN. The operation controller 122 may set a refresh operation, a DC level, and/or an AC timing of the second die 120 according to the first and second temperature deviation information D_TEMP_OTHER and D_TEMP_OWN.

Also, although this example of the memory device 100k has been shown and described as a multi-chip package including one second die 120 which senses temperature states and calculates a temperature deviation based on the sensed temperature states, the memory device 100j may include a plurality of second dies 120.

Figure 18:
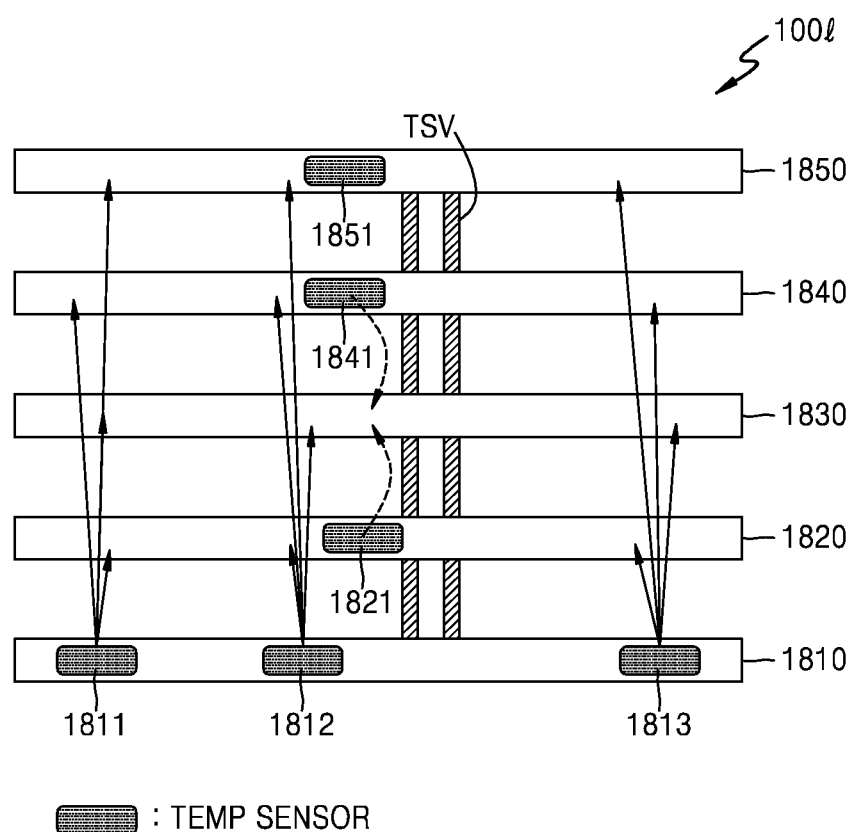
FIG. 18 is a sectional view in schematic form of one version of a multi-chip package according to the inventive concept.

FIG. 18 illustrates another example of a memory device in the form of multi-chip package according to the inventive concept.

Referring to FIG. 18, the memory device 100l has a plurality of vertically stacked dies 1810 through 1850.

One of the dies of the memory device 100l, namely die 1830 in this example, does not have a temperature sensor, and each of the other dies 1810, 1820, 1840, and 1850 has at least one temperature sensor.

Temperature sensors 1811, 1812, and 1813 of the first die 1810 may output temperature information of n bits representative of a temperature state of the first die 1810. A temperature sensor 1821 of the second die 1820 may output temperature information of n bits representative of a temperature state of the second die 1820. A temperature sensor 1841 of the fourth die 1840 may output temperature information of n bits representative of a temperature state of the fourth die 1840. A temperature sensor 1851 of the fifth die 1850 may output temperature information of n bits representative of a temperature state of the fifth die 1850.

Each of the first, second, fourth, and fifth dies 1810, 1820, 1840, and 1850 may output temperature characteristic information of m bits, the m bits being less than the n bits, based on the temperature information of n bits. The temperature characteristic information may represent the temperature of a corresponding die or a difference between the temperatures sensed by the temperature sensors of a die.

The first die 1810 of the memory device 100l may be a logic die, and the second through fifth dies 1820 through 1850 may be memory dies. The temperature characteristic information of the first die 1810 may be provided to the second through fifth dies 1820 through 1850 via TSVs.

The third die 1830 which does not include any temperature sensor may receive the temperature characteristic information that is output from the temperature sensors 1821 and 1841 of the second and fourth dies 1820 and 1840, i.e., from the temperature sensors of the dies adjacent to the third die 1830, via the TSVs. The third die 1830 may be configured, i.e., have an operation controller configured to, control an internal operation of the third die 1830 based on the temperature characteristic information received from the first, second, and fourth dies 1810, 1820, and 1840. The third die 1830 may set a refresh operation, a DC level, and/or an AC timing of the third die 1830 according to the temperature characteristic information of m (m<n) bits rather than the temperature information of n bits of the other dies 1810, 1820, and 1840.

Figure 19:
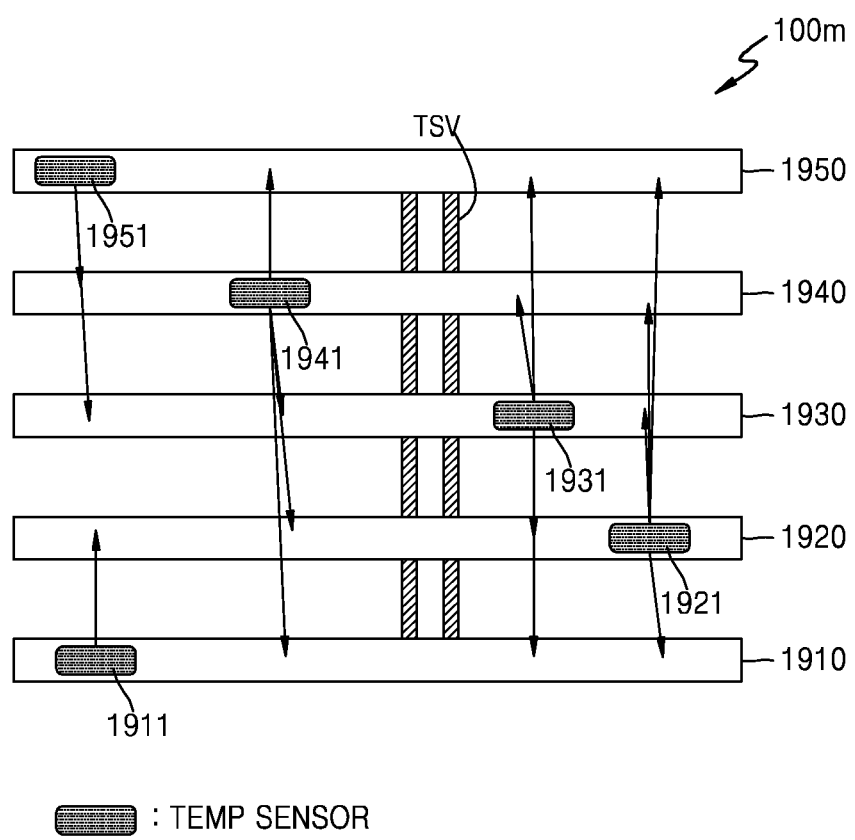
FIG. 19 is a sectional view in schematic form of another version of a multi-chip package according to the inventive concept.

FIG. 19 illustrates still another example a memory device in the form of a multi-chip package according to the inventive concept.

Referring to FIG. 19, memory device 100m may have a structure in which dies 1910 through 1950 are vertically stacked. The plurality of dies 1910 through 1950 may perform memory functions. One of the plurality of dies 1910 through 1950 may perform a logic function, i.e., may serve as a logic die in addition to a memory die.

Referring to FIG. 19, the plurality of dies 1910 through 1950 of the memory device 100m include temperature sensors, respectively, to sense temperature states of different areas. The first die 1910 may provide temperature characteristic information of m bits, the m bits being less than the n bits, to the second through fourth dies 1920 through 1940, via TSVs, based on temperature information of n bits which is sensed by the temperature sensor 1911 of the first die 1910. The first die 1910 may receive the temperature characteristic information of m bits from the second through fourth dies 1920 through 1940, via the TSVs. The first die 1910 may set a refresh operation, a DC level, and/or an AC timing of the first die 1910, according to the temperature information of n bits of the first die 1910 and the temperature characteristic information of m bits which is provided by the adjacent dies.

Likewise, each of the second through fifth dies 1920 through 1950 may set a refresh operation, a DC level, and/or an AC timing of each corresponding die according to the temperature information of n bits which is produced by its own temperature sensor, and the temperature characteristic information of m bits which is provided by the adjacent dies.

Figure 20:
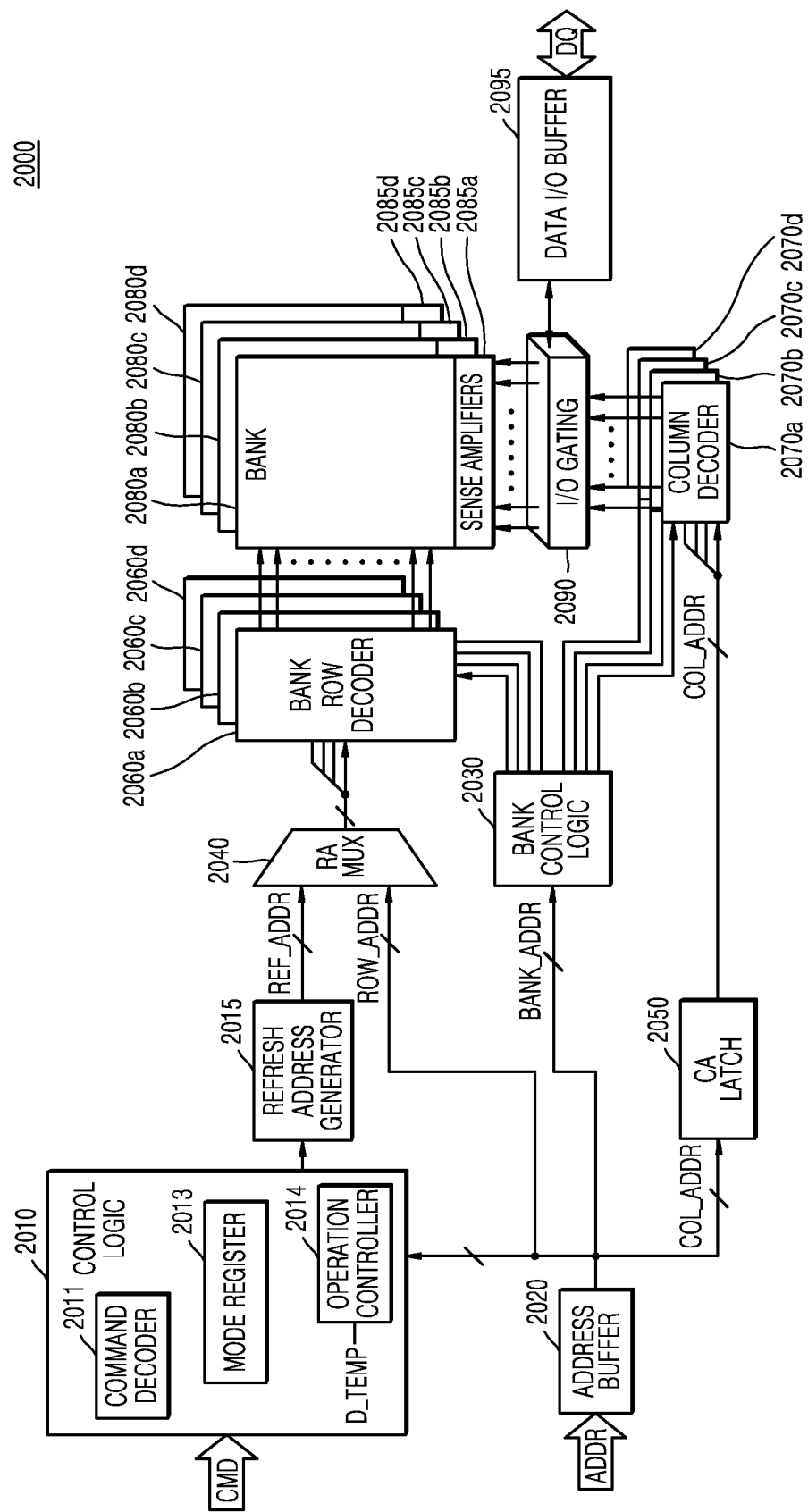
FIG. 20 is a block diagram of a memory device according to the inventive concept.

FIG. 20 illustrates a memory device 2000 for controlling an operation by using a temperature deviation, according to the inventive concept.

Referring to FIG. 20, the memory device 2000 is described as a memory die in a multi-chip package. The multi-chip package may include a logic die mounted adjacent to the memory die. The logic die may include a plurality of temperature sensors, and the temperature deviation information D_TEMP of m (m<n) bits may be generated based on the temperature information of n bits of the temperature sensors. The temperature deviation information D_TEMP may be provided to the memory device 2000 via TSVs and/or signal wirings including wire bonds.

The memory device 2000 may include a control logic 2010, a refresh address generator 2015, an address buffer 2020, a bank control logic 2030, a row address multiplexer 2040, a column address latch 2050, a row decoder, a memory cell array, a sense amplifier, an input/output gating circuit 2090, and a data input/output buffer 2095.

A memory cell area may include first through fourth bank arrays 2080a, 2080b, 2080c, and 2080d. Each of the first through fourth bank arrays 2080a, 2080b, 2080c, and 2080d may include a plurality of memory cell rows (or pages) and sense amplifiers 2085a, 2085b, 2085c, and 2085d which are connected to the memory cell rows, respectively.

The row decoder may include first through fourth bank row decoders 2060a, 2060b, 2060c, and 2060d connected to the first through fourth bank arrays 2080a, 2080b, 2080c, and 2080d, respectively. The column decoder may include first through fourth bank column decoders 2070a, 2070b, 2070c, and 2070d connected to the first through fourth bank arrays 2080a, 2080b, 2080c, and 2080d, respectively.

The first through fourth bank arrays 2080a, 2080b, 2080c, and 2080d, the first through fourth bank row decoders 2060a, 2060b, 2060c, and 2060d, and the first through fourth bank column decoders 2070a, 2070b, 2070c, and 2070d may form the first through fourth memory banks, respectively. FIG. 20 illustrates the memory device 2000 including four memory banks. However, the memory device 2000 may include a random number of memory banks.

Also, according to the inventive concept, the memory device 2000 may be a dynamic random access memory (DRAM) device, such as double data rate synchronous dynamic random access memory (DDR SDRAM), low power double data rate (LPDDR) SDRAM, graphics double data rate (GDDR) SDRAM, and rambus dynamic random access memory (RDRAM), or a resistive memory device, such as phase change random access memory (PRAM), magnetic random access memory (MRAM), and resistive random access memory (RRAM).

The control logic 2010 may control an operation of the memory device 2000. For example, the control logic 2010 may generate control signals for the memory device 2000 to perform a write or read operation. The control logic 2010 may include a command decoder 2011 for decoding commands CMD received from a memory controller, a mode register 2013 for setting an operation mode of the memory device 2000, and an operation controller 2014 for controlling a refresh operation, a DC level, and/or an AC timing of the memory device 2000 according to the temperature deviation information D_TEMP of the adjacent dies including the temperature sensors.

The command decoder 2011 may generate control signals corresponding to the commands CMD, by decoding a write enable signal /WE, a row address strobe signal /RAS, a column address strobe signal /CAS, a chip selection signal /CS, etc. The commands CMD may include an active command, a read command, a write command, a precharge command, etc.

The mode register 2013 may provide a plurality of operation options of the memory device 2000 and may program various functions, characteristics, and modes of the memory device 2000.

The control logic 2010 may further receive differential clocks CLK_t/CLK_c and clock enable signals CKE for driving the memory device 2000 by a synchronization method. The data of the memory device 2000 may operate by a double data rate. The clock enable signal CKE may be captured at a rising edge of the clock CLK_t.

The control logic 2010 may control the refresh address generator 2015 to perform an auto refresh operation in response to a refresh command, or may control the refresh address generator 2015 to perform a self-refresh operation in response to a self-refresh command.

The refresh address generator 2015 may generate a refresh address REF_ADDR corresponding to a memory cell row in which the refresh operation is to be performed. The refresh address generator 2015 may generate the refresh address REF_ADDR by a refresh cycle defined by the standards of a non-volatile memory device.

When the memory device 2000 is the above-described resistive memory, the refresh address generator 2015 might not be necessary.

The address buffer 2020 may receive addresses ADDR including a bank address BANK_ADDR, a row address ROW_ADDR, and a column address COL_ADDR from the memory controller. Also, the address buffer 2020 may provide the received bank address BANK_ADDR to the bank control logic 2030, provide the received row address ROW_ADDR to the row address multiplexer 2040, and provide the received column address COL_ADDR to the column address latch 2050.

The bank control logic 2030 may generate bank control signals in response to the bank address BANK_ADDR. In response to the bank control signals, a bank row decoder corresponding to the bank address BANK_ADDR, from among the first through fourth bank row decoders 2060a, 2060b, 2060c, and 2060d, may be activated, and a bank column decoder corresponding to the bank address BANK_ADDR, from among the first through fourth bank column decoders 2070a, 2070b, 2070c, and 2070d, may be activated.

The bank control logic 2030 may generate bank group control signals in response to the bank address BANK_ADDR determining a bank group. In response to the bank group control signals, the row decoders of the bank group corresponding to the bank address BANK_ADDR, from among the first through fourth bank row decoders 2060a, 2060b, 2060c, and 2060d, may be activated, and the column decoders of the bank group corresponding to the bank address BANK_ADDR, from among the first through fourth bank column decoders 2070a, 2070b, 2070c, and 2070d, may be activated.

The row address multiplexer 2040 may receive the row address ROW_ADDR from the address buffer 2020, and receive the refresh row address REF_ADDR from the refresh address generator 2015. The row address multiplexer 2040 may selectively output the row address ROW_ADDR and the fresh row address REF_ADDR. The row address that is output by the row address multiplexer 2040 may be applied to each of the first through fourth bank row decoders 2060a, 2060b, 2060c, and 2060d.

The bank row decoder that is activated by the bank control logic 2030, from among the first through fourth bank row decoders 2060a, 2060b, 2060c, and 2060d, may decode the row address ROW_ADDR that is output by the row address multiplexer 2040 and activate a word line corresponding to the row address. For example, the activated bank row decoder may apply a word line driving voltage to the word line corresponding to the row address.

The column address latch 2050 may receive the column address COL_ADDR from the address buffer 2020, and temporarily store the received column address COL_ADDR. The column address latch 205 may gradually increase the column address COL_ADDR received in a burst mode. The column address latch 2050 may apply the temporarily stored or gradually increased column address COL_ADDR to each of the first through fourth bank column decoders 2070a, 2070b, 2070c, and 2070d.

The bank column decoder that is activated by the bank control logic 2030, from among the first through fourth bank column decoders 2070a, 2070b, 2070c, and 2070d, may activate a sense amplifier corresponding to the bank address BANK_ADDR and the column address COL_ADDR via the input/output gating circuit 2090.

The input/output gating circuit 2090 may include an input data mask logic, read data latches for storing data that is output from the first through fourth bank arrays 2080a, 2080b, 2080c, and 2080d, and a write driver for writing data in the first through fourth bank arrays 2080a, 2080b, 2080c, and 2080d, together with circuits for gating input/output data.

The write data that is to be written in a memory cell array of one from among the first through fourth bank arrays 2080a, 2080b, 2080c, and 2080d may be provided to the data input/output buffer 2095 from the memory controller via a memory buffer. The data provided in the data input/output buffer 2095 may be written in one bank array via a write driver.

Figure 21:
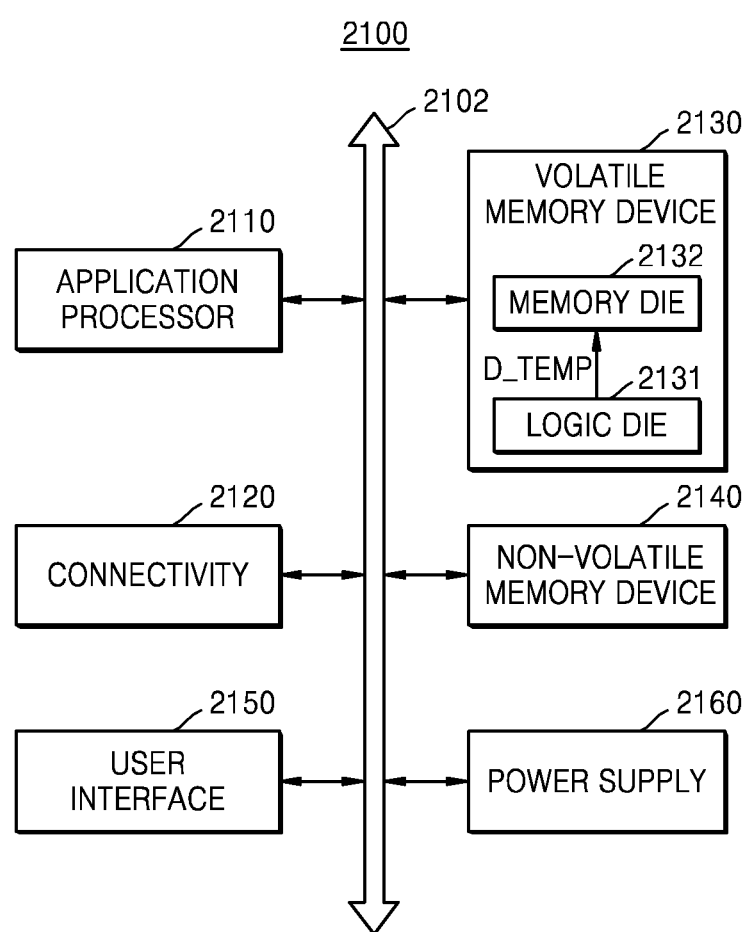
FIG. 21 is a block diagram of a mobile system to which a memory device is applied, according to the inventive concept.

FIG. 21 illustrates a mobile system 2100 having a memory device for controlling an operation by using a temperature deviation according to the inventive concept.

Referring to FIG. 21, the mobile system 2100 may include an application processor 2110, a connectivity unit 2120, a first memory device 2130, a second memory device 2140, a user interface 2150, and a power supply 2160 connected with one another via a bus 2102. The first memory device 2130 may be set as a volatile memory device, and the second memory device 2140 may be set as a non-volatile memory device. According to the inventive concept, the mobile system 2100 may be any mobile system, such as a mobile phone, a smart phone, a personal digital assistant (PDA), a portable multimedia player (PMP), a digital camera, a music player, a portable game console, and a navigation system.

The application processor 2110 may execute applications for providing an internet browser, a game, a video, etc. According to the inventive concept, the application processor 2110 may include a single core processor, or a multi-core processor. For example, the application processor 2110 may include a dual-core processor, a quid-core processor, and a hexa-core processor. Also, according to the inventive concept, the application processor 2110 may further include a cache memory located inside or outside the application processor 2110.

The connectivity unit 2120 may perform wireless communication or wired communication with external devices. For example, the connectivity unit 2120 may perform ethernet communication, near field communication (NFC), radio frequency identification (RFID) communication, mobile telecommunication, memory card communication, universal serial bus (USB) communication, etc. For example, the connectivity unit 2020 may include a baseband chipset, and may support communications, such as global system for mobile communication (GSM), general packet radio service (GPRS), wideband code division multiple access (WCDMA), and high speed packet access (HSPA).

The first memory device 2130 which is a volatile memory device may store data processed by the application processor 2110 as write data, or may operate as a working memory. The first memory device 2130 may be realized as a multi-chip package including the logic die 2131 including temperature sensors and the memory die 2132 not including the temperature sensors. The logic die 2131 provides the temperature deviation information D_TEMP of m (m<n) bits which is obtained by collecting and calculating temperature information of n bits of the temperature sensors, to the memory die 2132. The second die 2132 may control an internal operation (a refresh operation, a DC level, and/or an AC timing) by using temperature deviation information D_TEMP.

The second memory device 2140 which is a non-volatile memory device may store a boot image for booting the mobile system 2100. For example, the non-volatile memory device 2140 may be realized as electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or other similar memories.

The user interface 2150 may include one or more input devices, such as a keypad and a touch screen, and/or one or more output devices, such as a speaker and a display device. An operation voltage of the power supply 2160 may be supplied. Also, according to the inventive concept, the mobile system 2100 may further include a camera image processor (CIP), and may further include a storage device, such as a memory card, a solid state drive (SSD), a hard disk drive (HDD), and a CD-ROM.

Figure 22:
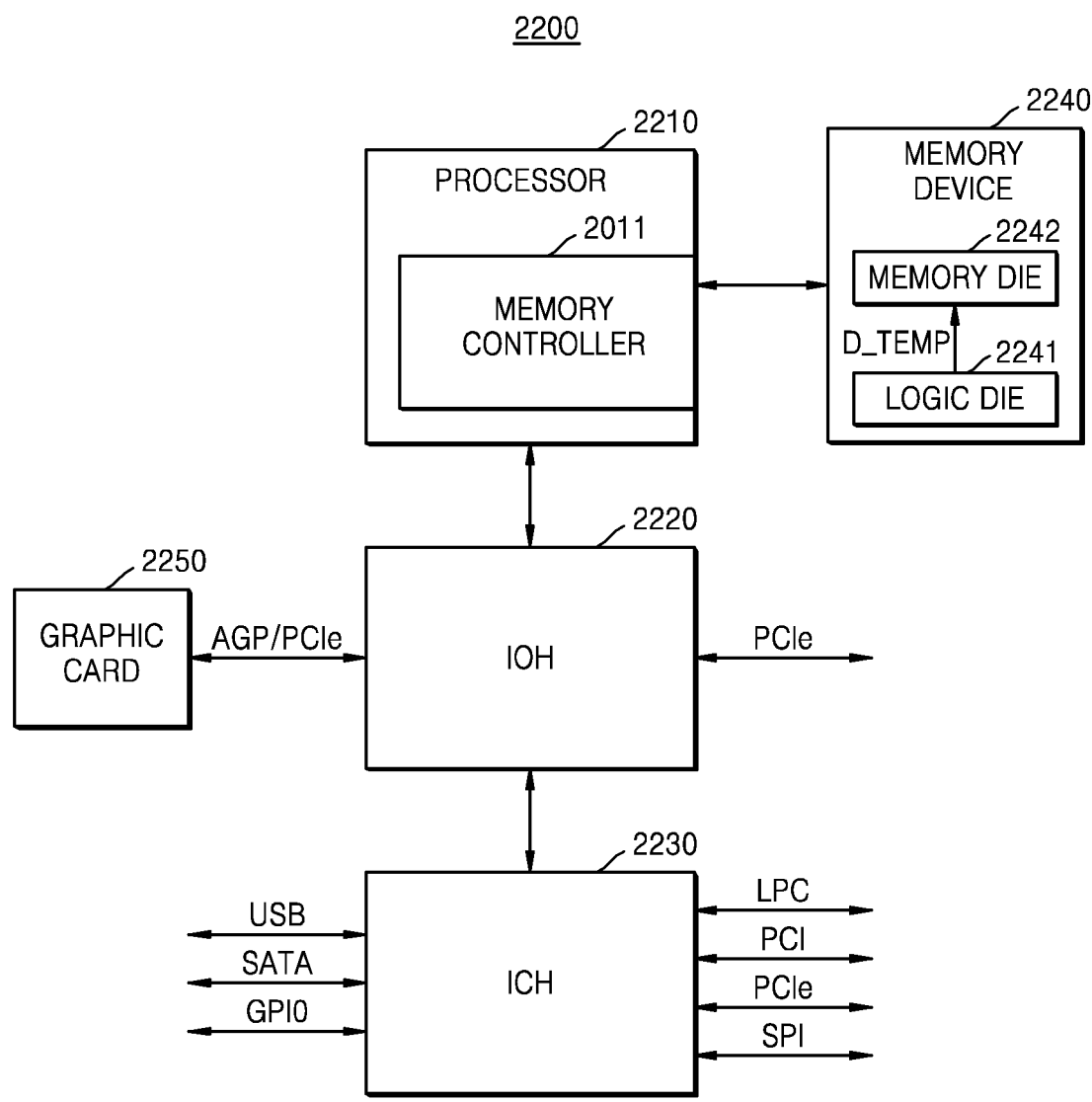
FIG. 22 is a block diagram of a computing system to which a memory device is applied, according to the inventive concept.

FIG. 22 illustrates a computing system 2200 having a memory device for controlling an operation by using a temperature deviation according to the inventive concept.

Referring to FIG. 22, the computing system 2200 includes a processor 2210, an input/output hub 2220, an input/output controller hub 2230, a memory device 2240, and a graphic card 2250. According to the inventive concept, the computing system 2200 may be any computing system, such as a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, and a navigation system.

The processor 2210 may execute various computing functions such as specific calculations or tasks. For example, the processor 2210 may be a microprocessor or a central processing unit (CPU). According to the inventive concept, the processor 2210 may include a single core processor or a multi-core processor. For example, the processor 2210 may include a dual-core processor, a quad-core processor, and a hexa-core processor. Also, although FIG. 22 illustrates that the computing system 2200 includes one processor 2210, the computing system 2200 may include a plurality of processors, according to the inventive concept. Also, according to the inventive concept, the processor 2210 may further include a cache memory located inside or outside the processor 2210.

The processor 2210 may include a memory controller 2211 controlling an operation of the memory device 2240. The memory controller 2211 included in the processor 2210 may be referred to as an integrated memory controller (IMC). According to the inventive concept, the memory controller 2211 may be located in the input/output hub 2220. The input/output hub 2220 including the memory controller 2211 may be referred to as a memory controller hub (MCH).

The memory device 2240 may be realized as a multi-chip package including the logic die 2241 including temperatures sensors and a memory die 2242 not including temperature sensors. The logic die 2241 provides the temperature deviation information D_TEMP of m (m<n) bits which is obtained by collecting and calculating the temperature information of n bits of the temperature sensors, to the memory die 2242. The second die 2242 may control an internal operation (a refresh operation, a DC level, and/or an AC timing) by using the temperature deviation information D_TEMP.

The input/output hub 2220 may manage a data transfer between devices such as the graphic card 2250, and the processor 2210. The input/output hub 2220 may be connected to the processor 2210 via various methods of interfaces. For example, the input/output hub 2220 and the processor 2210 may be connected with each other via various standard interfaces, such as front side bus (FSB), system bus, hyper transport, lighting data transport (LDT), quick path interconnect (QPI), a common system interface, peripheral component interface-express (CSI), etc. Although FIG. 22 illustrates the computing system 2200 including one input/output hub 2220, the computing system 2200 may include a plurality of input/output hubs, according to the inventive concept.

The input/output hub 2220 may provide various interfaces with devices. For example, the input/output hub 2220 may provide an accelerated graphics port (AGP) interface, a peripheral component interface-express (PCIe) interface, a communications streaming architecture (CSA) interface, etc.

The graphic card 2250 may be connected to the input/output hub 2220 via the AGP or the PCIe. The graphic card 2250 may control a display device (not shown) for displaying an image. The graphic card 2250 may include an internal processor for processing image data, and an internal semiconductor memory device. According to the inventive concept, the input/output hub 2220 may include a graphic device which is located therein, together with the graphic card 2250 which is located outside the input/output hub 2220. Alternatively, the input/output hub 2220 may include the graphic device which is located therein, instead of the graphic card 2250. The graphic device included in the input/output hub 2220 may be referred to as integrated graphics. Also, the input/output hub 2220 including the memory controller and the graphic device may be referred to as a graphics and memory controller hub (GMCH).

The input/output controller hub 2230 may perform data buffering and interface intervention for various system interfaces to efficiently operate. The input/output controller hub 2230 may be connected to the input/output hub 2220 via an internal bus. For example, the input/output hub 2220 and the input/output controller hub 2230 may be connected with each other via a direct media interface (DMI), a hub interface, an enterprise southbridge interface (ESI), PCIe, etc.

The input/output controller hub 2230 may provide various interfaces with peripheral devices. For example, the input/output controller hub 2230 may provide a universal serial bus (USB) port, a serial advanced technology attachment (SATA) port, general purpose input/output GPIO, a low pin count (LPC) bus, a serial peripheral interface (SPI), PCI, PCIe, etc.

According to the inventive concept, two or more components selected from the processor 2210, the input/output hub 2220, and the input/output controller hub 2230 may be realized as a chip set.

While the inventive concept has been particularly shown and described with reference to examples thereof, it will be understood that various changes in form and details may be made thereto without departing from the spirit and scope of the inventive concept as set forth in the following claims.

What is claimed is:

1. A memory device comprising:
a first die including first temperature sensors configured to generate first temperature information and a first temperature calculator configured to generate first calculated temperature information based on the first temperature information; and
a second die including a memory cell array, second temperature sensor configured to generate second temperature information, and a second temperature calculator configured to receive the first calculated temperature information from the first die,
wherein the second die is configured to adjust an operation parameter of the second die based on the second temperature information and the first calculated temperature information.

2. The memory device of claim 1, wherein the first die and the second die are stacked and further comprise through silicon vias (TSVs) extending vertically between the first die and the second die.

3. The memory device of claim 2, wherein the number of the first temperature sensors in the first die is greater than the number of the second temperature sensor in the second dies.

4. The memory device of claim 1, wherein the first die is configured to calculate a temperature difference between the highest temperature and the lowest temperature constituting the first temperature information and output first temperature deviation information.

5. The memory device of claim 4, wherein the first die is configured to calculate the first temperature deviation information based on the temperature difference and a temperature environment variable representative of a structural characteristic of a multi-chip package.

6. The memory device of claim 1, wherein the first die is configured to select the highest temperature or the lowest temperature from among temperatures constituting the first temperature information, calculate a temperature difference between the selected temperature and a reference temperature, and output the temperature difference as first temperature deviation information.

7. The memory device of claim 1, wherein the first die comprises a memory cell array.

8. The memory device of claim 1,
wherein the operation parameter of the second die comprises at least one of a duration of refresh operations of rows of memory cells of the memory cell array, a DC voltage level of the second die, and an AC timing of the second die.

9. The memory device of claim 1, wherein the first die comprises a logic die and the second die comprises a memory die.

10. A memory device comprising:
a first die including first temperature sensors configured to generate first temperature information and a first temperature calculator configured to generate first calculated temperature information based on the first temperature information;
a second die including a first memory cell array, second temp sensor configured to generate second temperature information, and a second temperature calculator configured to receive the first calculated temperature information from the first die and output second calculated temperature information;
a third die including a second memory cell array, third temp sensor configured to generate third temperature information, and a third temperature calculator configured to receive the second calculated temperature information from the second die;
first through silicon vias (TSVs) electrically connecting the first die and the second die; and
second TSVs electrically connecting the second die and the third die,
wherein the first calculated temperature information is provided to the second die from the first die via the first TSVs, and the first calculated temperature information is provided to the third die from the second die via the second TSVs.

11. The memory device of claim 10, wherein the first die comprises a logic die and the second and the third dies comprise memory dies.

12. The memory device of claim 10, wherein the number of the first temperature sensors is greater than the number of the second temperature sensor and the third temperature sensor.

13. The memory device of claim 12, wherein the number of the second temperature sensor is equal to the number of the third temperature sensor.

14. The memory device of claim 10, wherein locations of the second temperature sensor in the second die are identical to locations of the third temperature sensor in the third die.

15. The memory device of claim 14, wherein locations of the first temperature sensor in the first die are different from locations of the second temperature sensor in the second die.

16. The memory device of claim 10, wherein the second die is configured to adjust an operation parameter of the second die based on the second temperature information and the first calculated temperature information, and
wherein the third die is configured to adjust an operation parameter of the third die based on the third temperature information and the first calculated temperature information.

17. The memory device of claim 16, wherein the operation parameters of the second die and the third die comprise at least one of a duration of refresh operations of rows of memory cells of the first and the second memory cell array, a DC voltage level of the second die and the third die, and an AC timing of the second die and the third die.

* * * * *